US010326620B2

(12) United States Patent
Tajalli et al.

(10) Patent No.: US 10,326,620 B2
(45) Date of Patent: Jun. 18, 2019

(54) METHODS AND SYSTEMS FOR BACKGROUND CALIBRATION OF MULTI-PHASE PARALLEL RECEIVERS

(71) Applicant: Kandou Labs, S.A., Lausanne (CH)

(72) Inventors: Armin Tajalli, Salt Lake City, UT (US); Richard Simpson, Belford (GB)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 15/992,105

(22) Filed: May 29, 2018

(65) Prior Publication Data

US 2018/0351769 A1 Dec. 6, 2018

Related U.S. Application Data

(60) Provisional application No. 62/512,743, filed on May 31, 2017.

(51) Int. Cl.
*H04L 25/02* (2006.01)
*H04L 25/14* (2006.01)
(Continued)

(52) U.S. Cl.
CPC ..... *H04L 25/0272* (2013.01); *H03K 17/6871* (2013.01); *H03L 7/06* (2013.01);
(Continued)

(58) Field of Classification Search
CPC ..... H04L 25/0272; H04L 25/14; H04L 25/40; H04L 5/0007; H03L 7/06; H03M 13/31;
(Continued)

(56) References Cited

U.S. PATENT DOCUMENTS 7,339,990 B2   3/2008  Hidaka
7,869,497 B2   1/2011  Benvenuto
(Continued)

OTHER PUBLICATIONS

Reza Navid et al, "A 40 Gb/s Serial Link Transceiver in 28 nm CMOS Technology", IEEE Journal of Solid-State Circuits, vol. 50, No. 4. Apr. 2015, pp. 814-827.
(Continued)

*Primary Examiner* — Daniel D Chang
(74) *Attorney, Agent, or Firm* — Invention Mine LLC

(57) ABSTRACT

Methods and systems are described for receiving a plurality of signals in a signaling interval at a multi-input comparator (MIC), and responsively generating an analog linear combination of the received signals, amplifying the analog linear combination of the received signals using an integration stage, receiving the amplified differential voltage at two multi-phase receivers, each multi-phase receiver comprising one or more processing slices, each multi-phase receiver operating in a multi-phase processing path for processing the amplified differential voltage, wherein processing the amplified differential voltage includes generating output data decisions and phase-error information using a first multi-phase receiver of the two multi-phase receivers and selectively adjusting local speculative decision feedback equalization (DFE) slicing offsets of a second multi-phase receiver of the two multi-phase receivers according to the output data decisions generated by the first multi-phase receiver.

28 Claims, 27 Drawing Sheets

(51) Int. Cl.
  *H04L 25/40* (2006.01)
  *H04L 5/00* (2006.01)
  *H04J 13/00* (2011.01)
  *H03K 17/687* (2006.01)
  *H04B 17/364* (2015.01)
  *H03M 13/31* (2006.01)
  *H03L 7/06* (2006.01)

(52) U.S. Cl.
  CPC .......... *H03M 13/31* (2013.01); *H04B 17/364* (2015.01); *H04J 13/004* (2013.01); *H04L 5/0007* (2013.01); *H04L 25/14* (2013.01); *H04L 25/40* (2013.01)

(58) Field of Classification Search
  CPC .. H04B 17/364; H04J 13/004; H03K 17/6871
  USPC ............................................ 326/86; 375/354
  See application file for complete search history.

(56) References Cited

U.S. PATENT DOCUMENTS

| | | | |
|---|---|---|---|
| 7,873,115 | B2 | 1/2011 | Zerbe |
| 8,472,513 | B2 | 6/2013 | Malipatil |
| 8,744,012 | B1 | 6/2014 | Ding |
| 8,791,735 | B1 | 7/2014 | Shibasaki |
| 9,083,576 | B1 | 7/2015 | Hormati |
| 9,520,883 | B2 | 12/2016 | Shibasaki |
| 2006/0233291 | A1 | 10/2006 | Garlepp |
| 2008/0069198 | A1* | 3/2008 | Bhoja ................. H04L 7/0334 375/233 |
| 2010/0020862 | A1 | 1/2010 | Peng |
| 2010/0329325 | A1 | 12/2010 | Mobin |
| 2011/0286497 | A1 | 11/2011 | Nervig |
| 2012/0082203 | A1 | 4/2012 | Zerbe |
| 2012/0327993 | A1* | 12/2012 | Palmer ................... H04L 7/041 375/232 |
| 2013/0322512 | A1 | 12/2013 | Francese |
| 2014/0286381 | A1 | 9/2014 | Shibasaki |
| 2015/0117579 | A1 | 4/2015 | Shibasaki |
| 2015/0180642 | A1* | 6/2015 | Hsieh ................... H04L 7/0025 375/233 |
| 2015/0319015 | A1 | 11/2015 | Malhotra |
| 2017/0019276 | A1 | 1/2017 | Francese |
| 2017/0373889 | A1 | 12/2017 | Sakai |
| 2018/0083638 | A1* | 3/2018 | Tajalli ................... H04L 25/40 |

OTHER PUBLICATIONS

Hyosup Won et al, "A 28-Gb/s Receiver With Self-contained Adaptive Equalization and Sampling Point Control Using Stochastic Sigma-Tracking Eye-Opening Monitor", IEEE Transactions on Circuits and Systems—I: Regular Papers, vol. 64, No. 3, Mar. 2017. pp. 664-674.

* cited by examiner

METHODS AND SYSTEMS FOR BACKGROUND CALIBRATION OF MULTI-PHASE PARALLEL RECEIVERS

CROSS-REFERENCE TO RELATED APPLICATIONS

This application claims the benefit of U.S. Provisional Application No. 62/512,743, filed May 31, 2017, naming Armin Tajalli, entitled "Methods and Systems for Background Calibration of Multi-Phase Parallel Receivers", which is hereby incorporated herein by reference in its entirety for all purposes.

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/542,599, filed Jul. 5, 2012, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

U.S. Provisional Patent Application No. 62/326,593, filed Apr. 22, 2016, naming Armin Tajalli, entitled "Sampler with Increased Wideband Gain and Extended Evaluation Time", hereinafter identified as [Tajalli IV].

U.S. Provisional Patent Application No. 62/326,591, filed Apr. 22, 2016, naming Armin Tajalli, entitled "High Performance Phase Locked Loop", hereinafter identified as [Tajalli V].

FIELD OF THE INVENTION

The present embodiments relate to communications systems circuits generally, and more particularly to obtaining an instantaneous measurement and filtering of a received signal voltage relative to a provided clock signal, as one component of detecting received communications signals from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or mGore receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. The timing of this sampling or slicing operation is controlled by an associated Clock and Data Recovery (CDR) timing system, which determines the appropriate sample timing. [Stewart I] and [Tajalli V] provide examples of such CDR systems.

BRIEF DESCRIPTION

To reliably detect the data values transmitted over a communications system, a receiver must accurately measure the received signal value amplitudes at carefully selected times. In some embodiments, the value of the received signal is first captured at the selected time using a known sample-and-hold or track-and-hold circuit (or known variants such as amplify-and-hold or integrate-and-hold), and then the resulting value is measured against one or more reference values using a known voltage comparator circuit. Other embodiments first use a comparator to "slice" the analog signal and obtain a digital result, then digitally sample the resulting binary value using a clocked digital latch.

Other embodiments utilize circuits capable of applying both the time- and amplitude-domain constraints, producing a result that represents the input value at a particular time and relative to a provided reference level. [Tajalli III] provides examples of such embodiments, in which the high frequency gain of the sampling circuit may be advantageously boosted over a narrow frequency range, in a so-called high frequency peaking action as graphically illustrated by the gain vs. frequency chart of FIG. 6A.

It is also possible to provide enhanced signal gain over a wide frequency range, as shown by the gain vs. frequency chart of FIG. 6B and described in the embodiments herein. Additional embodiments are described in which the clocked sampling action is further enhanced by reliance on dynamic circuit operation rather than the static mode of operation used in [Tajalli III].

Methods and systems are described for receiving a plurality of signals in a signaling interval at a multi-input comparator (MIC), and responsively generating an analog linear combination of the received signals, amplifying the analog linear combination of the received signals using an integration stage, receiving the amplified differential voltage at two multi-phase receivers, each multi-phase receiver comprising a one or more processing slices, each multi-phase receiver operating in a multi-phase processing path for processing the amplified differential voltage, wherein processing the amplified differential voltage includes generating output data decisions and phase-error information using a first multi-phase receiver of the two multi-phase receivers and selectively adjusting local speculative decision feedback equalization (DFE) slicing offsets of a second multi-phase receiver of the two multi-phase receivers according to the output data decisions generated by the first multi-phase receiver.

DETAILED DESCRIPTION

To reliably detect the data values transmitted over a communications system, a communications receiver must accurately measure its received signal value amplitudes at carefully selected times, typically at or near the center of that received signal's period of stability between transitions. This point is commonly described as the "center of eye", (referring to the well-known "eye diagram" of signal amplitude vs. clock intervals) and is typically determined by use of a local "receive clock" which is configured to occur at that desirable sampling time. Generation and ongoing control of such receive clock timing is well understood in the art, as Clock Data Alignment (CDA) systems measure and incrementally adjust sample timing versus receive signal stability time to optimize sample timing.

In some embodiments, the value of the received signal is first captured at the selected time using a sample-and-hold or track-and-hold circuit, and then the resulting value is measured against one or more reference values using a known voltage comparator circuit.

Figure 6A:
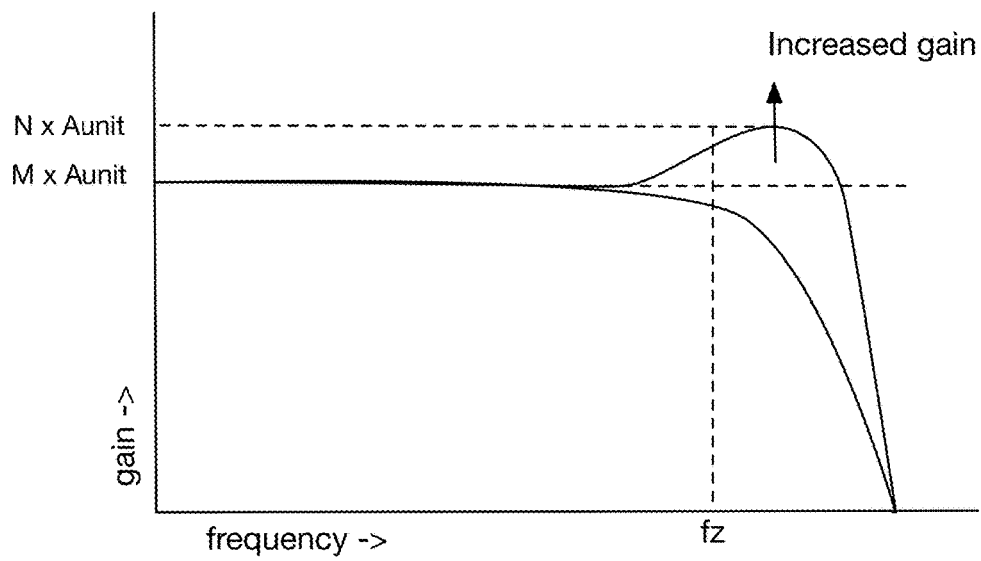
FIG. 6A is a gain vs. frequency plot showing high frequency "peaking" gain enhancement as provided by the circuit of FIG. 1.

Other embodiments utilize circuits capable of applying both the time- and amplitude-domain constraints, producing a result that represents the input value at a particular time and relative to a provided reference level. [Tajalli III] provides examples of such voltage sampler embodiments, in which the high frequency gain of the sampling circuit may be advantageously boosted over a narrow frequency range, in a so-called high frequency peaking action as graphically illustrated by the gain vs. frequency chart of FIG. 6A. Such high frequency peaking is particularly useful in receiver frequency compensation of communications channel characteristics. A further embodiment is described herein, in which the clocked sampling action is further enhanced by reliance on dynamic circuit operation rather than the static mode of operation used in [Tajalli III].

Figure 6B:
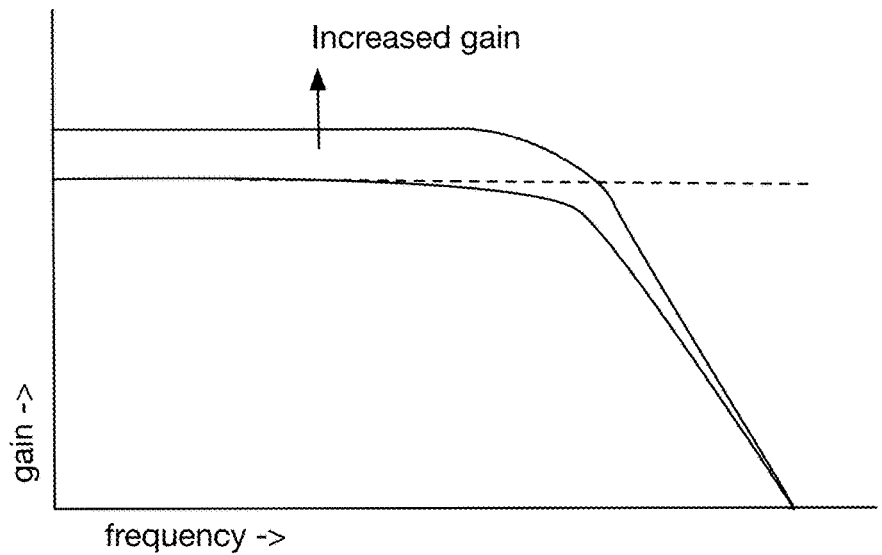
FIG. 6B is a gain vs. frequency plot showing wideband gain enhancement as provided by the circuit of FIG. 2.

Dynamic circuit operation may also be applied to wideband amplification to provide enhanced signal gain over a wide frequency range, as shown by the gain vs. frequency chart of FIG. 6B and described in embodiments herein.

The source of the input signal to the embodiments described herein may be derived from a single wire signal, or may be derived from a weighted linear combination of multiple wire signals, such as provided by a Multi Input Comparator or mixer (MIC) used to detect vector signaling codes.

Sampler with High Frequency Peaking

It is common for communications links to be operated at data transfer rates at or near the declining portion of the link's response vs. frequency curve. Thus, it is desirable for receivers to be configurable to provide additional high frequency gain, as compensation for the reduced response of the communications link.

Figure 1:
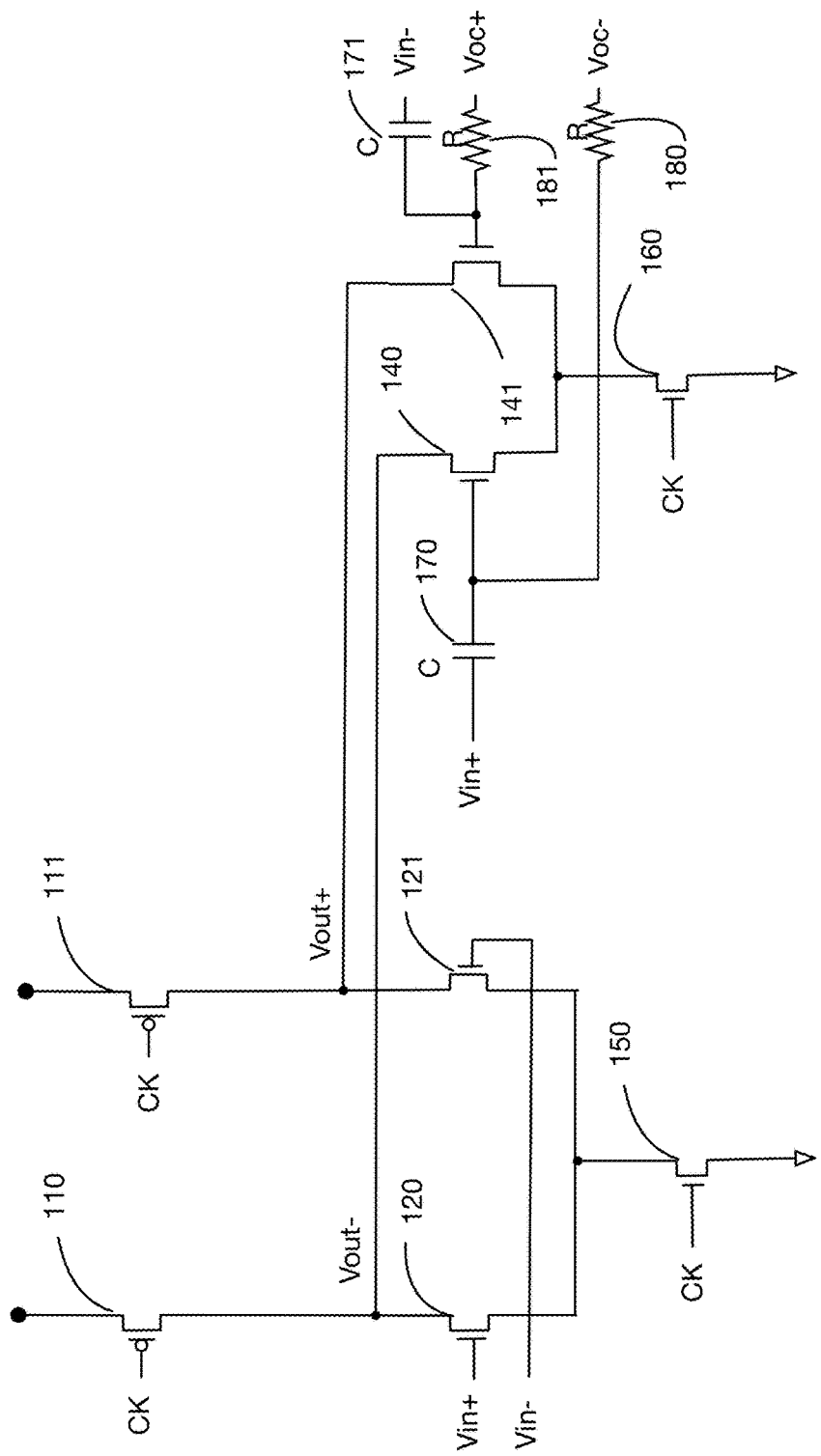
FIG. 1 is a schematic diagram of a voltage sampler with high frequency peaking and offset compensation.

[Tajalli III] provided one example of a sampler circuit capable of providing additional narrowband high frequency gain through use of a secondary gain path enabled by a frequency-selective RC network. The circuit of FIG. 1 provides another embodiment of this type with lower quiescent current draw, due to its reliance on dynamic switching mode in all transistors. Positive cycles of CK turn on transistors 110 and 111 pre-charging nodes Vout+ and Vout−, with the complementary or inverse phase of CK enables transistors 150 and 160, allowing those charges to flow through the differential transistor pairs 120/121 and 140/141 to ground, those momentary current flows being controlled by the voltage levels presented by inputs Vin+ and Vin−. Because of the non-overlap between charge sources and discharge sinks being on, this circuit draws essentially no quiescent current, and effectively samples input signals at the falling edge of CK.

As with the circuit of [Tajalli III], the parallel differential transistor pair 140/141 provides additional high-frequency peaking in this embodiment and optional offset voltage compensation, as the differential pair inputs are driven by Vin+ and Vin− with a frequency response shaped by high-pass RC filters 170/180, and 171/181 having a corner frequency of $$f_z \approx \frac{1}{2\pi RC}.$$

Incremental adjustment of offset correction voltages Voc+ and Voc− may be made as necessary to adjust the balance of differential outputs Vout.

As is common practice, $f_z$ will typically be chosen to be at or near the natural high frequency falloff of the received signal amplitude vs. frequency curve to provide the desired peaking characteristic, as illustrated in FIG. 6A.

Sampler with Increased Wideband Gain

Figure 2:
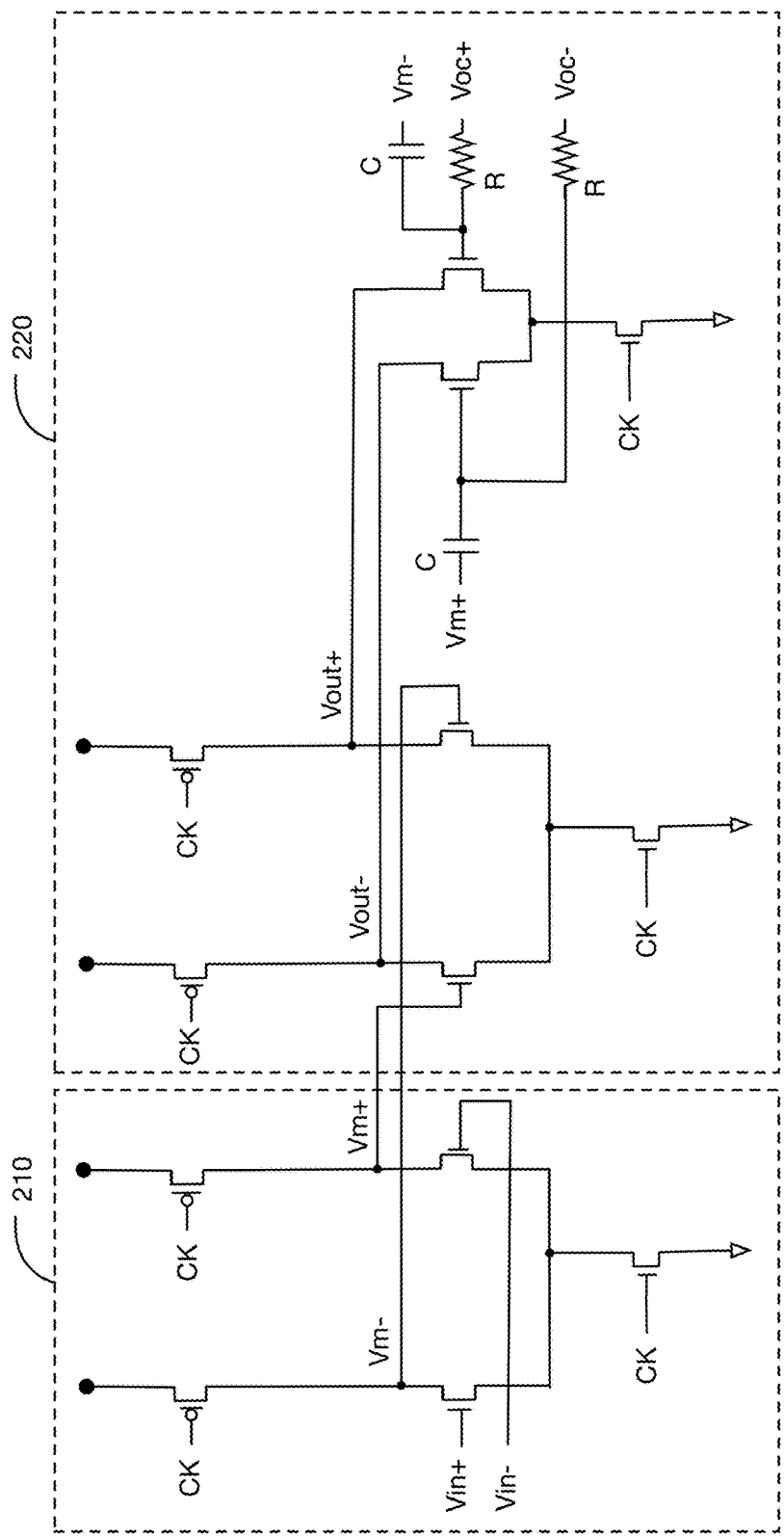
FIG. 2 is a schematic diagram of a voltage sampler embodiment with increased signal gain over a wide frequency range and offset compensation.

The same dynamic mode operation may be used in a sampling circuit with wideband gain, as shown in the schematic of FIG. 2.

Although a similar incremental-linear analysis may be applied here as in the previous example, an alternative interpretation may be of more descriptive value, especially in operational configurations where the clock frequency is significantly higher than corner frequency $f_z$. In this alternative analysis, first stage 210 effectively acts as a high frequency mixer, producing differential output signals Vm+ and Vm− which are effectively the carrier CK mixed with or modulated by differential input Vin. Second stage 220 then effectively acts as a synchronous demodulator, mixing Vm with CK to produce differential outputs Vout again. As the modulated carrier frequencies involved are higher than corner frequency $f_z$, the modulated signals effectively pass unaffected through capacitors C, allowing both differential pairs in 220 to provide gain at all signal frequencies. In one embodiment, the resulting transfer function was seen to be effectively flat over a wide frequency range, as illustrated in FIG. 6B, with approximately 6 dB of additional gain. As in the previous example, incremental adjustment of offset correction voltages Voc+ and Voc− may be made as necessary to adjust the balance of differential outputs Vout.

Sampler with Extended Evaluation Time

In switched dynamic circuits such as that of FIG. 2, the static voltage of internal nodes such as Vm+ and Vm− are dependent not only on the transistor action of the differential pair, but also on the integrating action of the distributed node capacitance on the charge transferred on CK transitions. This integrating behavior can become significant, especially when multiple dynamically clocked stages are cascaded as in this example.

Figure 3:
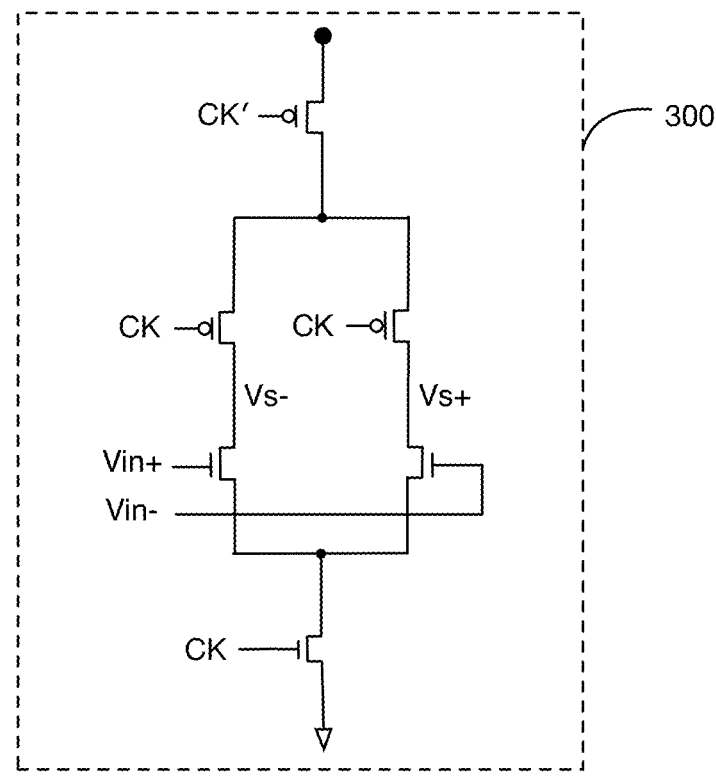
FIG. 3 is a schematic diagram of one embodiment of a dynamic mode CMOS sampling circuit allowing an extended input signal evaluation time.
Figure 3:
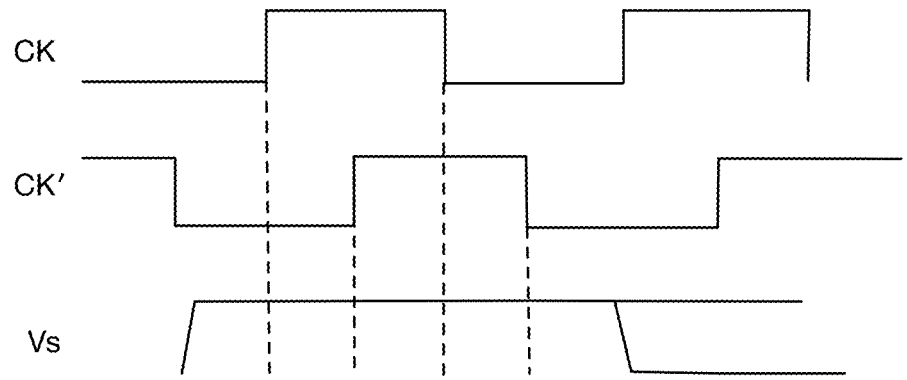

FIG. 3 shows the schematic diagram of a modified version of the previous sampler, in which two partially overlapping clocks CK and CK' are used to obtain extended input evaluation time. For descriptive purposes without implying a limitation, CK and CK' in this explanation are assumed to have an approximate quadrature relationship, as shown in the timing diagram of FIG. 3. In practice, both clocks may be generated by a multiphase clock generator, or one clock may be synthesized from the other using a delay element. During the first 90 degrees of the clock cycle, the sampler is reset by turning on the top three PMOS FETS that charge the Vs nodes to the supply voltage. On the rising edge of CK (during the second 90 degrees of the clock cycle) the Vs outputs take on differential output levels proportionate to the voltage levels seen at Vin− and Vin+, where one side is discharged to ground and the other remains charged at the supply voltage. Those levels remain unchanged while either CK or CK' is high. Specifically, in the third 90 degree portion, the addition of the top PMOS FET driven by the quadrature (or otherwise delayed) clock CK' prevents the recharge/reset action that would have otherwise occurred when CK returns low (turning off the tail current at the bottom and turning on the middle PMOS FETs to recharge Vs). Only after CK' goes low in conjunction with CK during the final 90 degrees do the output nodes Vs+ and Vs− get precharged to high levels during a reset interval Thus, the voltage sample occurs at the rising edge of CK, and is maintained through the falling edge of CK' (rather than merely the falling edge of CK). This extended output duration provides increased set-up time for a subsequent integrator/sampler or latch element.

Cascades of Clocked Samplers

Figure 4:
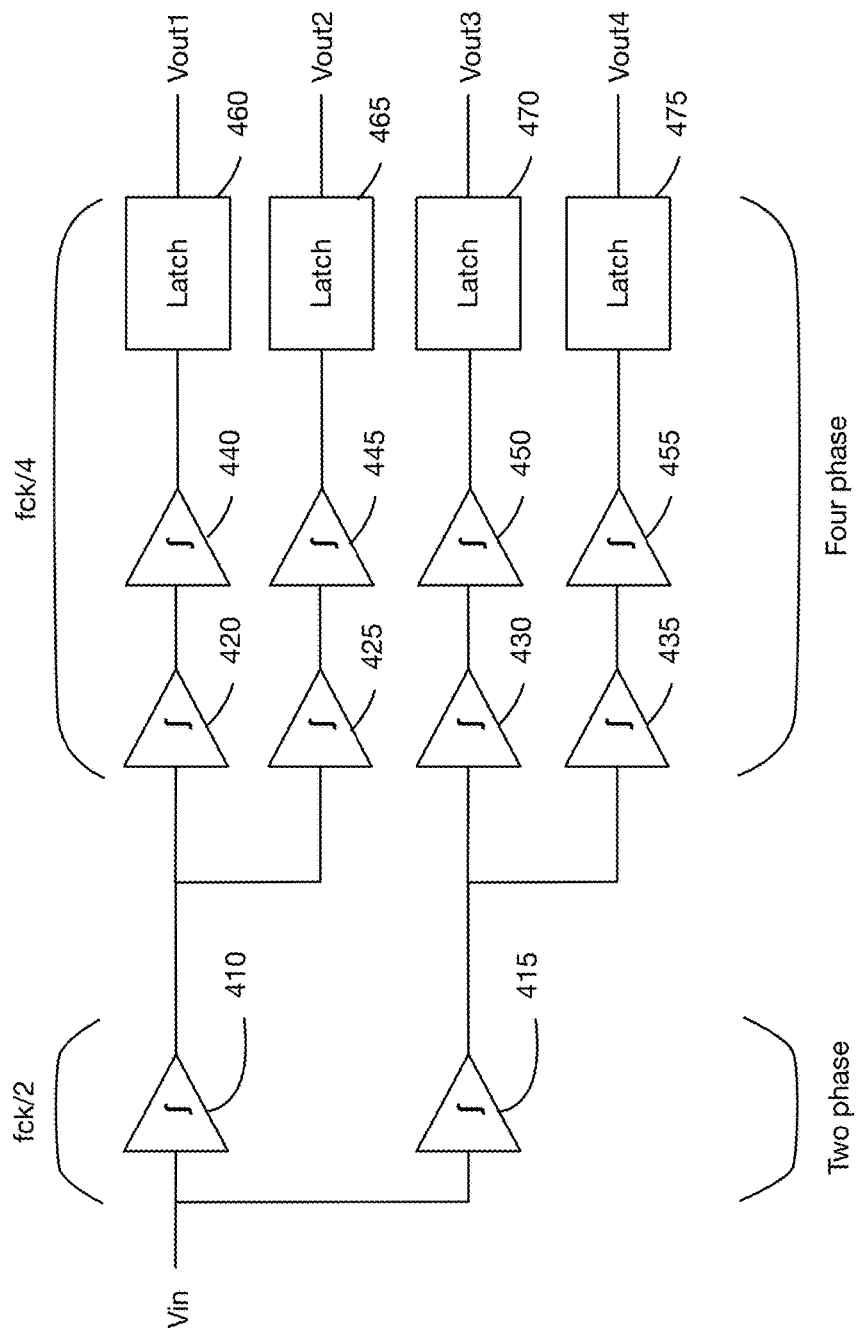
FIG. 4 is a block diagram showing a cascade of sampling integrator/amplifiers acting upon a single input signals and producing four results suitable for processing in four phases.

Clocked samplers with the described functionality are amenable to cascaded operation, as in the embodiment shown in the block diagram of FIG. 4. Input signal Vin is sampled at 410 and 415 by samplers operating on complementary phases of a two-phase sampling clock at frequency Fck/2. The resulting sampled results are each themselves sampled twice, by samplers operating on complementary phases of sampling clocks at frequency Fck/4. That is, each sampled result provided by 410 is alternately sampled by 420 or by 425 (as their sampling clock operates at one half the rate of the previous sample clock). Similarly, each sampled result provided by 415 is alternately sampled by 430 or by 435. The four results thus obtained are again sampled at 440, 445, 450, and 455, and those ultimate sampled results are digitally latched at 460, 465, 470, 475 to produce digital outputs Vout1, Vout2, Vout3, and Vout4. It should be further noted that the samplers described herein provide increased immunity to output loading, which my be particularly useful in embodiments such as FIG. 4 in which the signal is fanned out to multiple subsequent stages, as in the transition from two-phase to four-phase clock domains.

In practical embodiments, splitting data processing between two phase operation with its simple clocking regime, and four- (or greater) phase operation with its relaxed latency provides a useful tradeoff between power, speed, and complexity. Such cascaded samplers may be designed for any arbitrary number of resultant phases using known art clock division and/or clock steering logic, thus neither "two phase" nor "four phase" should be considered limiting in this description.

Figure 5:
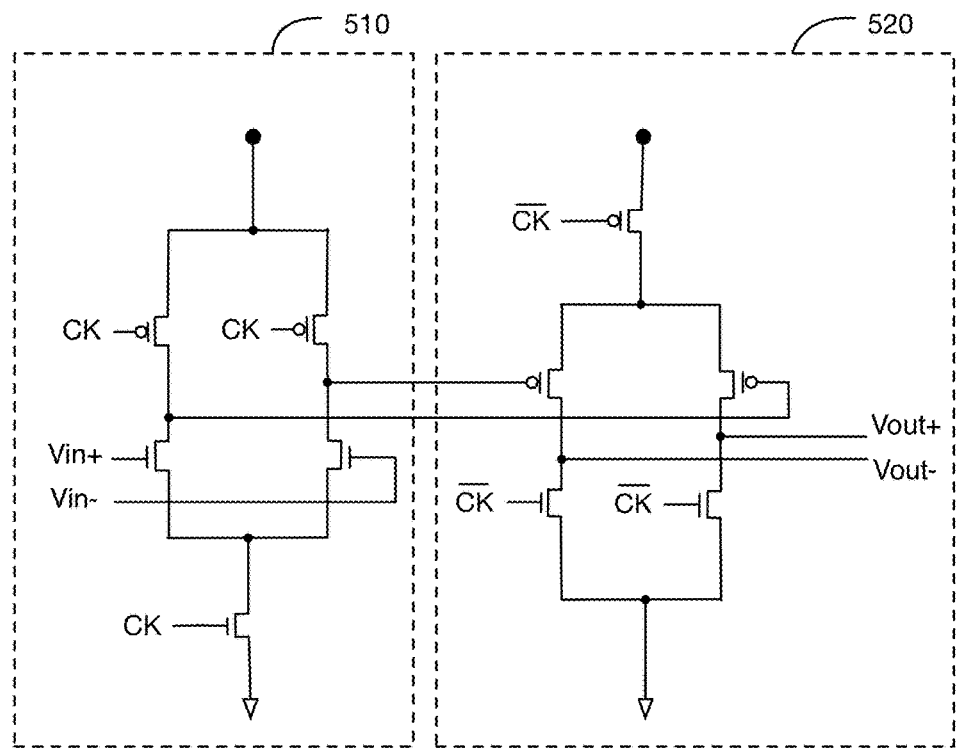
FIG. 5 is a schematic showing one embodiment of a dynamic mode CMOS self retimed integrator suitable for use as the samplers/integrators of FIG. 4.

FIG. 5 is a schematic diagram of one embodiment of a CMOS sampler/integrator particularly well suited to cascaded operation as in FIG. 4. Input clock CK and its compliment CK control first sampler stage 510 and second sampler stage 520 respectively. In practice, this alternation of complementary stages provides an advantageous self-retiming behavior that simplifies clocking where there are two or more consecutive stages of such sampler/integrators. Such cascaded sampler architectures also allow significant gain to be obtained; in one embodiment, 27 dB of gain was obtained from a series of such stages with only 0.5 mV of RMS noise.

Decision Feedback Equalization

Decision Feedback Equalization or DFE is a well-known technique used to improve signal detection capabilities in serial communication systems. It presumes that the transmission line characteristics of the communications channel between transmitter and receiver is imperfect, thus energy associated with previously transmitted bits may remain in the channel (for example, as reflections from impedance perturbations) to negatively impact reception of subsequent bits. A receiver's DFE system processes each bit detected in a past unit interval (UI) through a simulation of the communications channel to produce an estimate of that bit's influence on a subsequent unit interval. That estimate, herein called the "DFE correction", may be subtracted from the received signal to compensate for the predicted inter-symbol interference. Practical DFE systems produce DFE corrections derived from multiple previous unit intervals.

At very high data rates, there may not be sufficient time to detect a received bit, calculate its associated DFE correction, and apply that correction to the next received unit interval in time to detect the next bit. Thus, some embodiments utilize so-called "unrolled DFE", where correction values are determined for some or all possible combinations of previous data values, those speculative corrections are applied to multiple copies of the received signal, and speculative detections made of the resulting corrected signal instances. When the earlier data values are finally resolved, the correct speculatively detected output may be chosen as the received data value for that unit interval.

As may be readily apparent, "unrolling" of DFE for even a modest number of historical unit intervals in this way requires a significant number of speculative results to be maintained effectively in parallel, introducing significant circuit complexity and associated power consumption.

Cascaded Samplers with DFE

Figure 7:
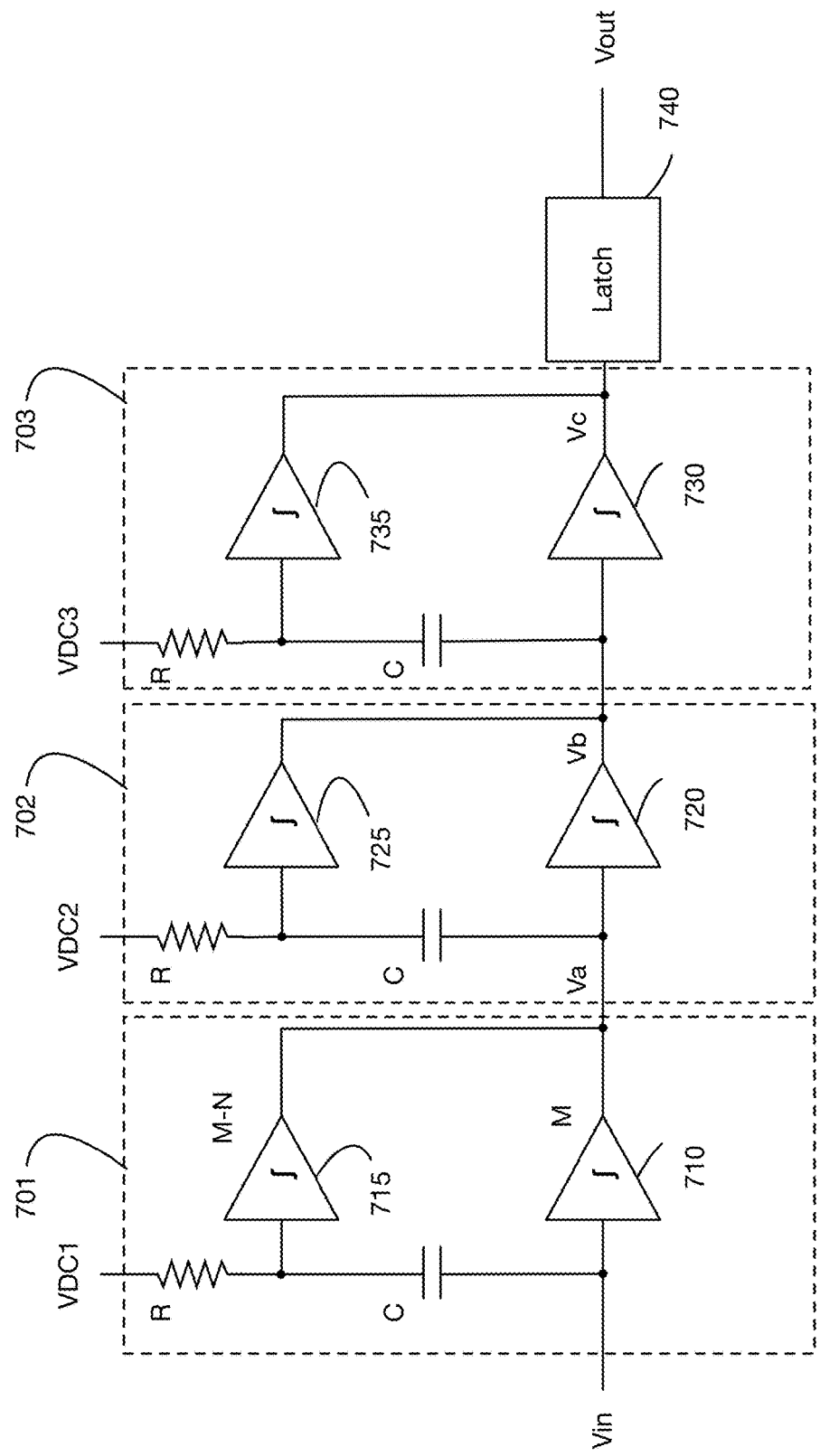
FIG. 7 illustrates one embodiment of a cascaded series of discrete time domain samplers providing increased wideband and high frequency gain with offset compensation.

The cascaded sampler embodiment of FIG. 7 provides an interesting alternative to unrolled DFE. As with previous examples, each primary Discrete Time Integration element (for example 710) is associated with a secondary Discrete Time Integration element (decision-feedback offset generator 715) providing offset compensation (DFE correction value VDC1) and boosted high frequency gain (determined by the time constant of RC.)

Figure 9:
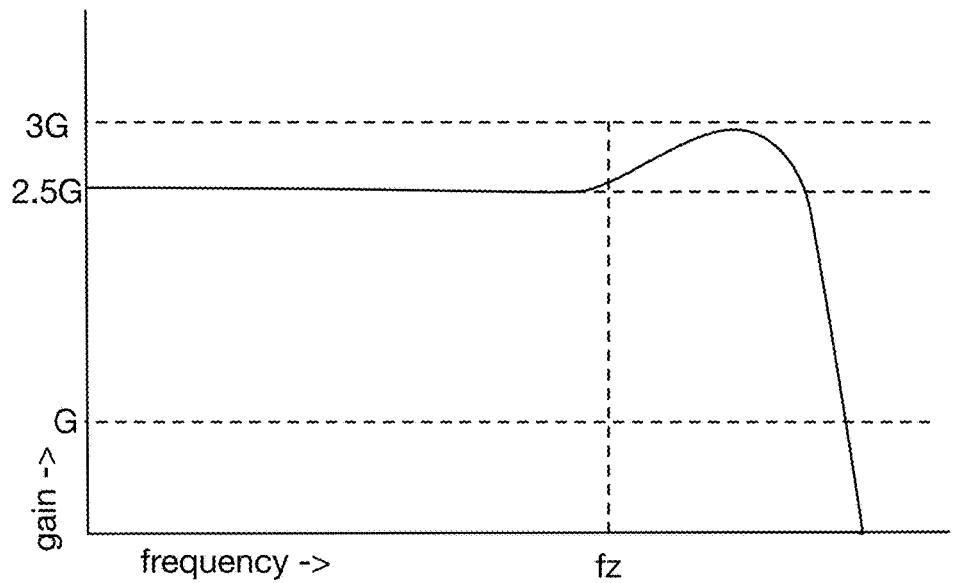
FIG. 9 is a frequency vs. gain plot for one cascaded sampler embodiment.

As the first stage composed of 710/715 is cascaded with the second stage of 720/725 and third stage of 730/735, significant signal gain is produced between input Vin and the ultimate data result sampled at Latch 740. The gain vs. frequency plot of one such embodiment is shown as FIG. 9, where "G" is the typical gain of a single stage composed of two Discrete Time Integration elements, each typically contributing a gain of approximately 0.5G.

Each Discrete Time Integration element 710, 715, 720, 725, 730, 735 in FIG. 7 may be as previously described as 210 of FIG. 2. In an alternative embodiment, alternating instances of FIG. 5's 510 and 520 may be used for consecutive stages of FIG. 7.

Figure 21:
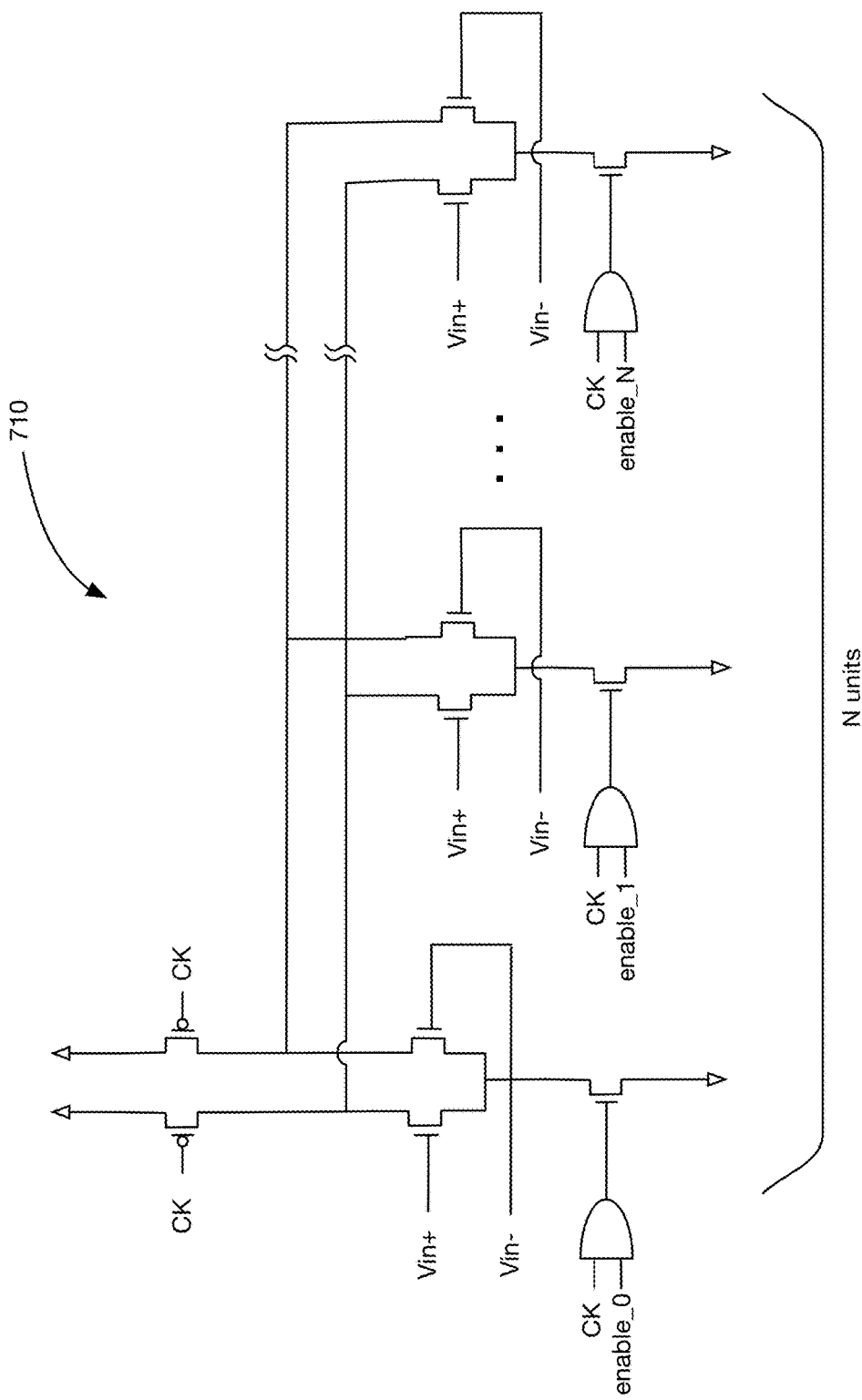
FIG. 21 is a schematic of a discrete time integrator (DTI) in accordance with some embodiments.

As shown in FIG. 7, each discrete time integration element may have an associated weight applied to it. FIG. 21 illustrates an exemplary discrete time integration (DTI) element, in accordance with some embodiments. As shown, the DTI element includes a single path for pre-charging the output nodes, and various paths for discharging current the output nodes. As shown, FIG. 21 includes N differential discharge pairs connected to the output nodes to discharge current. In some embodiments, each stage 701 may enable a fixed number N of differential discharge pairs between the combination of both DTIs. Specifically, DTI 710 may have M enabled differential discharge pairs while DTI 715 has M-N enabled differential discharge pairs. Each DTI may have N available differential discharge pairs, each differential discharge pair being selectably enabled. By enabling additional differential discharge pairs, additional drive current discharges the corresponding output nodes faster while the capacitance added by enabling the additional discharge pairs does not add significantly more capacitance, providing an amplification in the output. Most of the capacitance at the output nodes may be the wire/trace capacitance, as well as parasitic capacitance of the pre-charge transistors. As shown in FIG. 21, each differential discharge pair may be enabled by a logic AND of the clock signal CK and a corresponding enable signal of a set of N enable signals. Such embodiments may be tuned to adjust the frequency characteristics of the cascaded sampler. As described above, DTIs 710, 720, and 730 are all-pass in that they pass high frequency and low frequency content while DTIs 715, 725, and 735 pass only high frequency content. Thus, high frequency peaking may be adjusting by switching more differential discharge pairs in DTI 715 on or off, while keeping N differential discharge pairs on altogether between the combination of DTI 710 and 715. It should be noted that further embodiments may enable a total greater than or less than N, depending on desired circuit operation.

Referring to FIG. 6A and as described above, the number of differential discharge pairs may be controlled to adjust the frequency response of the system. For example, turning on a larger amount of differential discharge pairs in a high-frequency DTI 715 will push the gain higher for frequencies above $$fz = \frac{1}{RC}.$$

As shown in FIG. 6A, the low-frequency response may have a gain of MxAunit, where Aunit is the gain for a single DTI 710, as only M all-pass differential discharge pairs are on. Further, the high-frequency response may have a gain of NxAunit, as all N units are passing high-frequency content. In some embodiments, for a single stage (e.g., stage 701), the gain for Va/Vin (or generally, Vout/Vin) may be represented as:

$$\frac{Vout}{Vin} = N \cdot H_{AP}(s) + (N-M) \cdot H_{HP}(s),$$

where the frequency of response for the All-Pass (AP) DTI 710 is represented as:

$$H_{AP}(s) = \frac{gm}{N \cdot I_{avg}} \cdot V_{sn} \cdot \frac{RC}{RC+1},$$

where gm is the transconductance of a unit slicer cell, $I_{avg}$ is the average bias current of a unit slicer cell during discharge phase, and $V_{sn}$ is the integrator output voltage swing. A similar calculation may be derived for the high-pass response HP(s) DTI 715.

Figure 8:
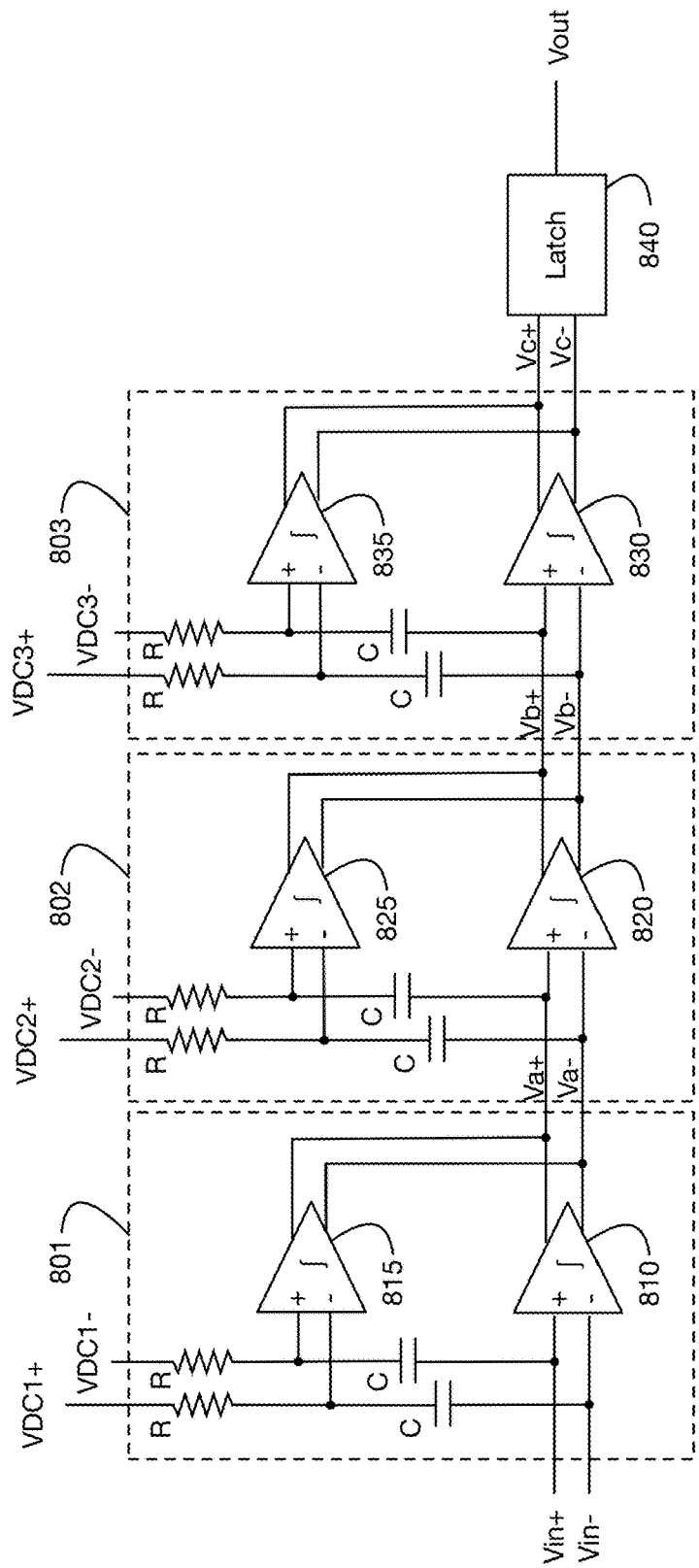
FIG. 8 illustrates a second embodiment of a cascaded series of discrete time domain samplers providing increased wideband and high frequency gain while supporting DC signal correction wherein each sampler stage has differential inputs and outputs.

As is well understood in the art, differential inputs as in the example Discrete Time Integration elements may be utilized as single-ended inputs by tying the unused second input to an appropriate source of DC bias and AC virtual ground. Alternatively, the fully differential embodiment of FIG. 8 may be used with either the elements of FIG. 2 or FIG. 5, all such variations being considered equivalent herein.

The DFE voltage magnitudes VDC1, VDC2, VDC3 of FIG. 7 (and for FIG. 8, their differential signal equivalents) may be used to correct fixed offset voltage errors or as inputs for DFE correction signals.

It should be noted that as the cascaded series of Discrete Time Integrators passes along sampled voltage output values in consecutive clock intervals, it constitutes a form of analog signal memory or analog delay line. Thus, in the case where the voltage inputs are used for DFE correction, those inputs may take on the appropriate DFE correction value (i.e. associated with the proper historical data value) at or before the sampling time, that association being relative to the sampled signal being processed by that stage at that time. For the embodiment shown in FIG. 8 where the correction voltage inputs are differential, it was observed that DFE correction values may be expressed as differential voltage pair {VDCa, VDCb} if the historical bit was a '1', and by the swapped pair {VDCb, VDCa} if the historical bit was a '0'. Thus, the equivalent of a dual pole dual throw switch could be used to modify a single DFE voltage magnitude value VDC, directing either the original value or the swapped (reverse polarity) value into that stage of the system, controlled by the historic data bit associated with that previous time unit interval.

In one embodiment, the DFE magnitude values of {VDCa, VDCb} are chosen such that the resulting voltages (both directly and with the described differential swapping) satisfy both the necessary DFE correction criterion and normalize undesirable DC offset in the Discrete Time Integrator cascade. In some embodiments, the DFE magnitude values VDC may include a DC voltage offset component.

Figure 10:
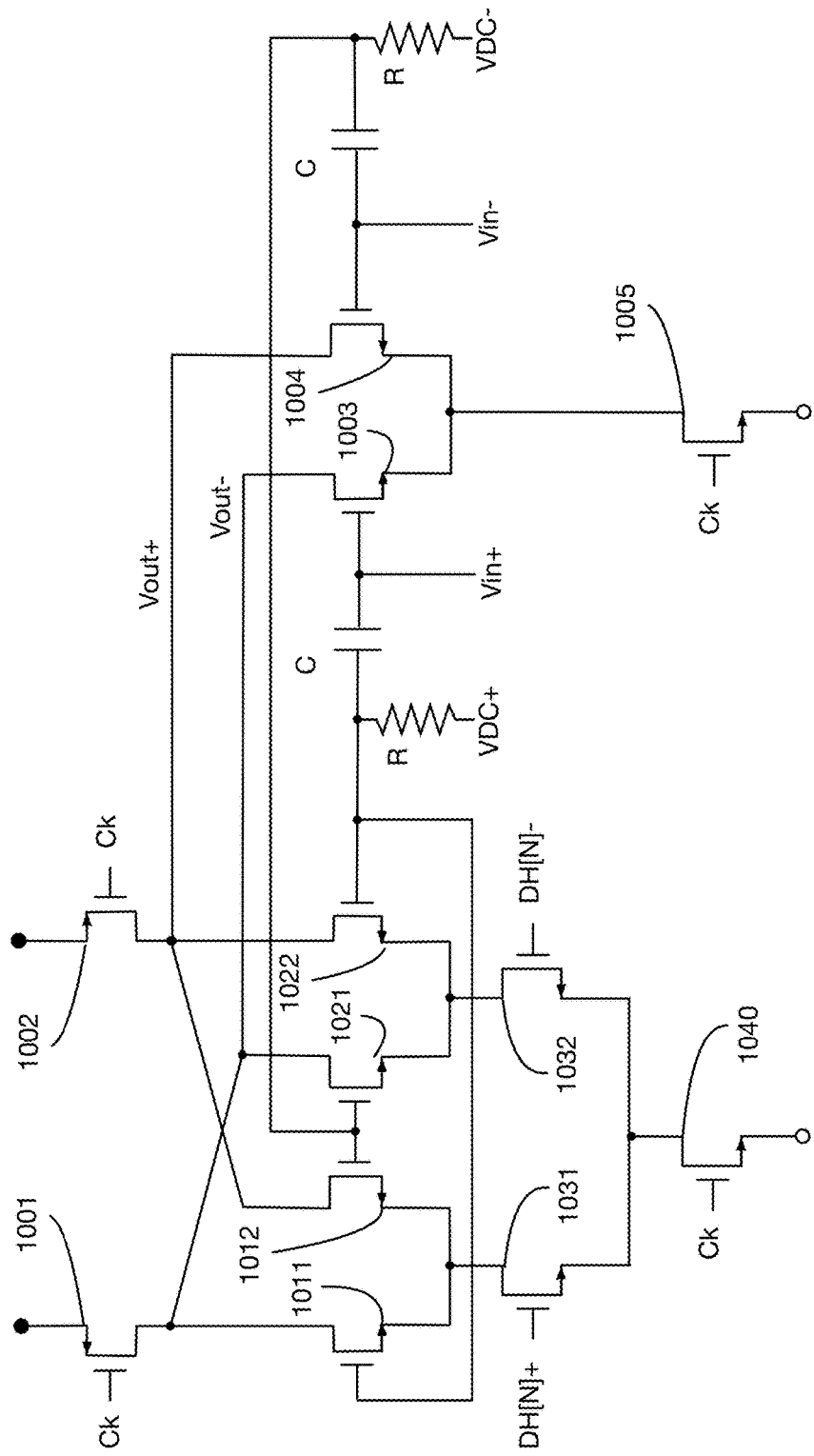
FIG. 10 is a schematic diagram of one embodiment of a sampler stage with increased high frequency gain and controllable-polarity offset compensation.

A further embodiment incorporates a modified Discrete Time Integrator embodiment as illustrated in FIG. 10. As with FIG. 8, all signals are differential. For avoidance of confusion, it should be noted that the schematic of FIG. 10 corresponds to one complete stage 801, 802, 803 of FIG. 8, comprising both Discrete Time Integrators, RC filter, etc., and adding a switching element to selectively swap a polarity of the DFE correction magnitude value under the control of a historical data input.

In this embodiment, the received analog input voltage Vin is sampled by transistors 1001, 1002, 1003, 1004, 1005 and augmented by high frequency peaking provided by filter networks RC and one of differential pairs 1011/1012 or 1021/1022 in the DFE offset generator and transistor 1040. The particular differential pair is selected by transistors 1031/1032 using historical data DH[N]+ and DH[N]−, the high frequency peaking result augmenting sampled analog voltage outputs Vout+ and Vout− with either a direct analog of the VDC+ and VDC− voltages, or their differentially swapped equivalent.

In some embodiments, an apparatus includes a memory device 1160 configured to store one or more historical data values, a Decision-Feedback Equalization (DFE) computation circuit 1150 configured to generate a DFE magnitude value, a decision-feedback offset generator (e.g., 1110, 1120, 1130) configured to receive the DFE magnitude value VDC and a historical data value DH[N] of the one or more historical data values, and to responsively generate an analog DFE correction value having a voltage magnitude equal to the DFE magnitude value and a polarity determined by the historical data value received from the memory device, and an analog sampler configured to receive an analog summation of the analog DFE correction value and an analog input signal Vin, and to generate a sampled voltage output Va according to a sampling clock Ck1. In the preceding embodiment, analog input signal Vin and sampled voltage output Va are with respect to decision-feedback offset generator 1110.

In some embodiments, the analog input signal is a sampled voltage output received from a cascaded analog sampler. In alternative embodiments, the analog input signal corresponds to an analog output of a multi-input comparator.

In some embodiments, the decision-feedback offset generator includes a pair of decision feedback branches 1011/1012 and 1021/1022, each decision feedback branch receiving the DFE magnitude value in respective inverse-polarity configurations, and a selection circuit 1031/1032 configured to receive the historical data value and to responsively enable one of the pair of decision feedback branches to determine the polarity of the DFE correction value. In some embodiments, the decision-feedback offset generator is further configured to receive a high-frequency injection of the analog input signal Vin. In some embodiments, the high-frequency injection of the analog input signal is received via a resistor-capacitor high-pass filter. In some embodiments, the decision-feedback offset generator is further configured to receive a voltage offset signal.

In some embodiments, the sampled voltage output has a propagation delay less than one unit-interval with respect to the received analog input signal. In alternative embodiments, the sampled voltage output has a propagation delay greater than one unit-interval with respect to the received analog input signal. In some embodiments, the memory device comprises a shift register.

Figure 11A:
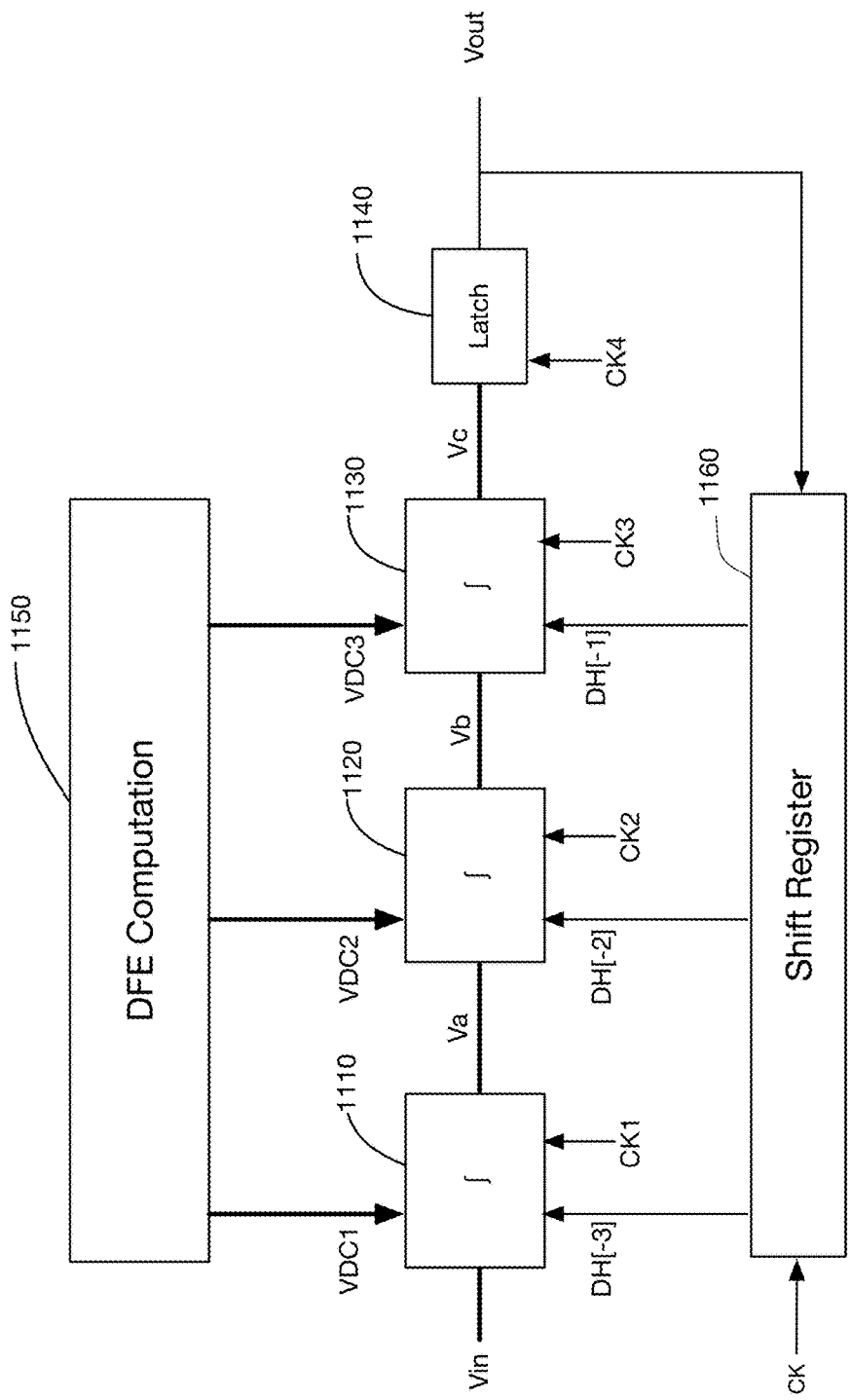
FIG. 11A is a block diagram of a cascaded system utilizing the sampler stages of FIG. 10.

The complete multistage embodiment shown in FIG. 11A utilizes three instances of FIG. 10 shown as 1110, 1120, 1130, and takes advantage of the analog delay characteristic of cascaded Discrete Time Integrators by configuring differential input VDC1 to be composed of the computed DFE correction for the [N−3] historical UI interval and DH[−3] the $3^{rd}$ previous data value, VDC2 to be composed of the computed DFE correction for the [N−2] historical UI interval and DH[−2] the $2^{nd}$ previous data value, and VDC3 to be composed of the computed DFE correction for the [N−1] (i.e. immediately preceding) historical UI interval and DH[−1] the immediately preceding data value (all such timing descriptions being relative to the current signal input Vin.) This provides the full duration of three unit intervals for the detection of a given data value, before that data value is required for use by the DFE system. As a non-limiting example, digital shift register 1160 is illustrated storing and providing the previous data values to stages 1130, 1120, and 1110 (i.e. in this illustration 1160 shifts to the left), each data value being sampled and detected by latch 1140 and also presented to data output Vout. DFE Computation 1150 is shown providing the previously-described DFE correction magnitude values VDC1, VDC2, VDC3, which represent the contribution of a given historical time unit interval to the observed perturbation of the current time unit interval's received signal. In some embodiments, VDC1, VDC2, and VDC3 may be represented as voltage magnitudes, whose polarity is determined by a historical data value. Each such voltage, combined with the polarity determined by selection information provided by the corresponding historical data bit for that historical time unit interval, produces a DFE correction value (also referred to herein as a DFE compensation value) appropriate to that processing stage's correction of the signal being sampled. As shown, each stage 1110-1130 receives a respective clock having respective delays. In some embodiments, the delay between any adjacent clock (CK1/CK2, CK2/CK3) may be on the order of 5-15 psec. Alternatively, each clock may have a fixed phase relationship such as a quadrature phase relationship generated by a local oscillator in a PLL. Such oscillators may take the form of ring oscillators, such as the ring oscillator 1180 shown in FIG. 11C.

Figure 13A:
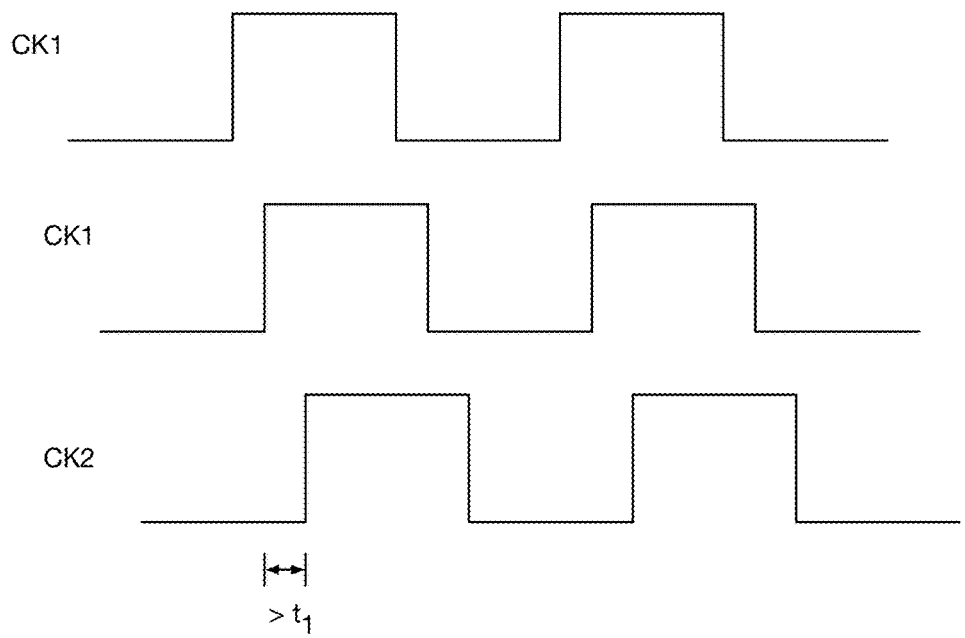
FIGS. 13A and 13B illustrate multi-stage sampling clock relationships, in accordance with some embodiments.
Figure 13B:
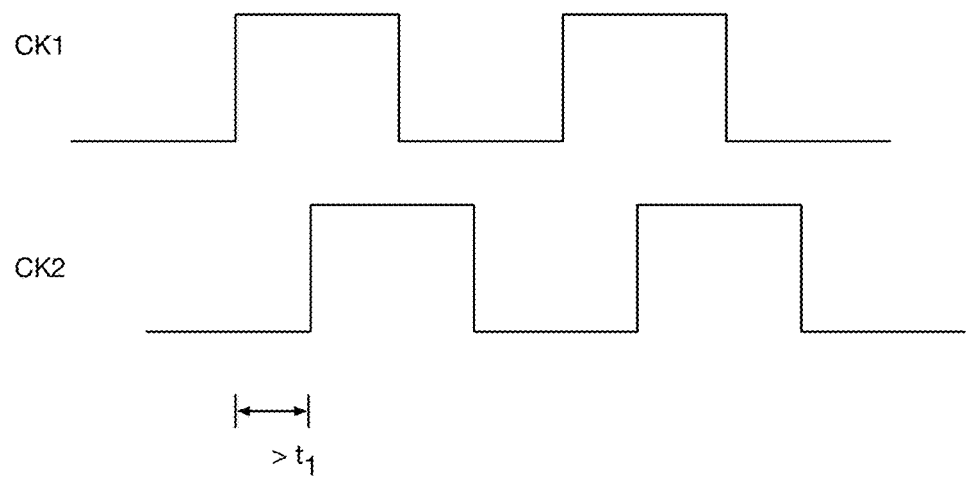
Figure 15A:
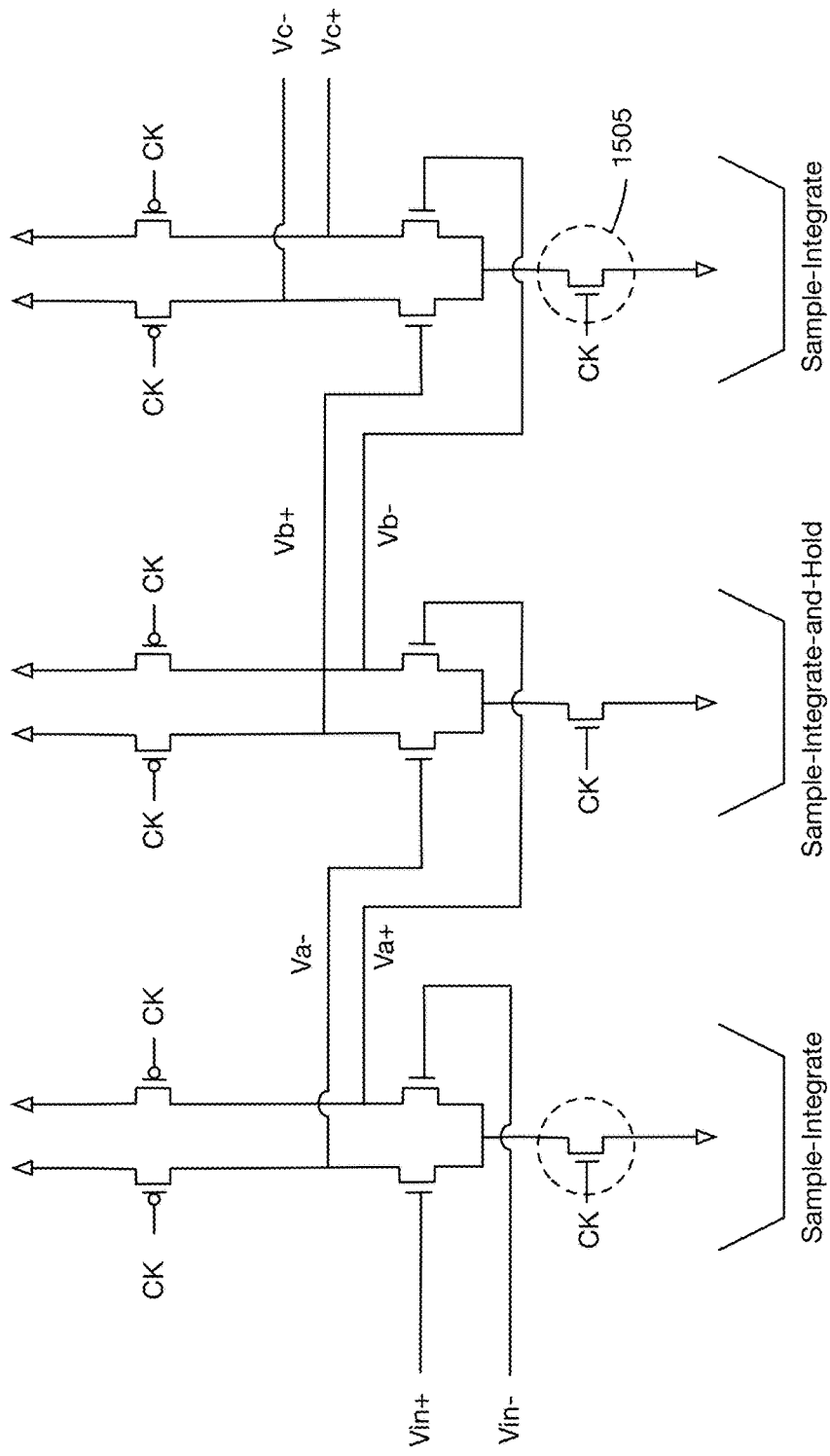
FIG. 15A is a schematic of a cascaded integrate-and-hold stage, in accordance with some embodiments.
Figure 16:
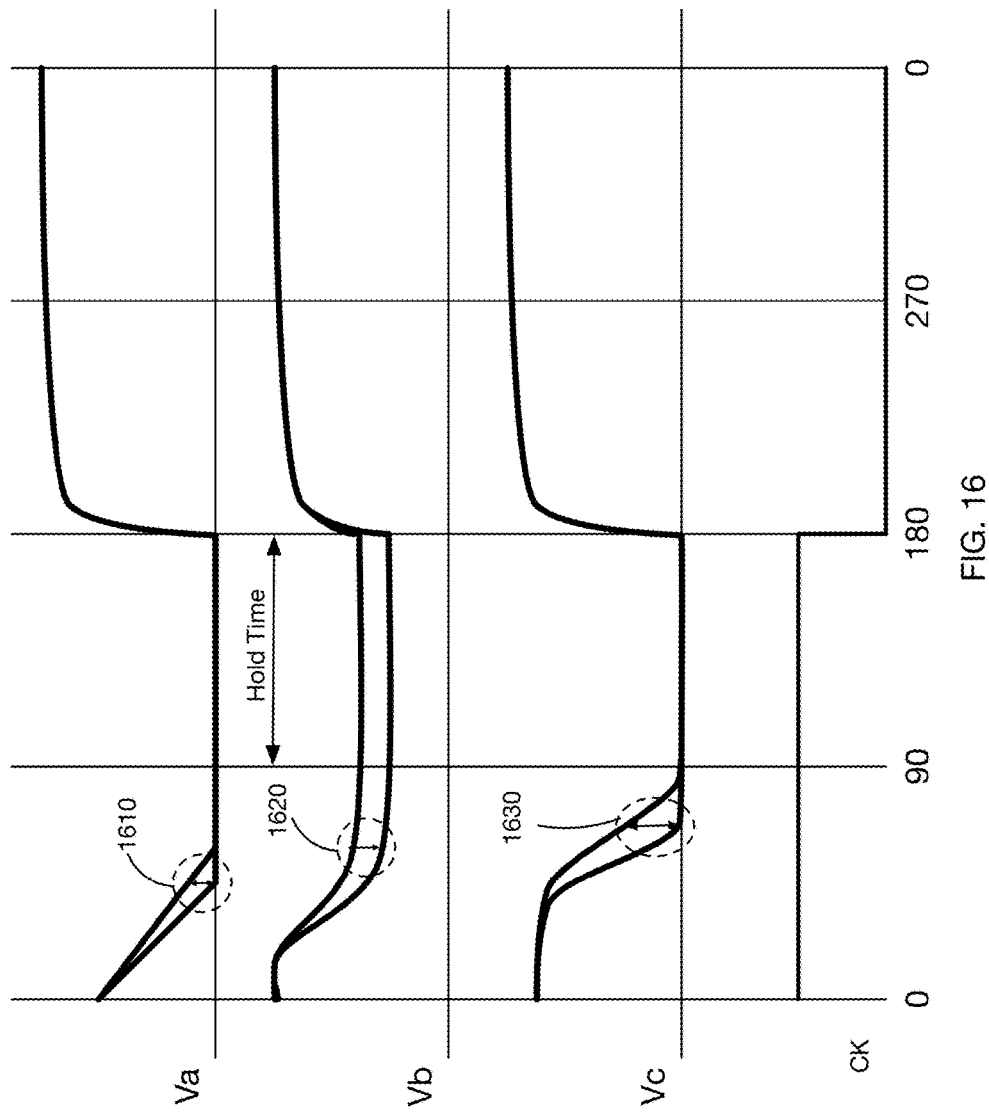
FIG. 16 is a timing diagram illustration discharging of pairs of nodes, in accordance with some embodiments.

FIG. 15A illustrates three cascaded sample-and-integrate circuits, in accordance with some embodiments. As shown, the middle stage provides an integrate-and-hold function. FIG. 15A may be explained in relation to the waveform shown in FIG. 16. While the sampling clock CK is low, the output nodes of each sampler may be pre-charged to a high voltage. When sampling clock CK goes high, the sampling interval initiates and the bottom transistors of each sampler turn on to begin discharging current from the corresponding output nodes. In some embodiments, each discrete time integrator may be clocked by a sampling clock having a delay with respect to the sampling clock of the previous stage, as illustrated in FIGS. 13A and 13B, and described in more detail below. The differential input voltage Vin is applied to the first stage of the cascaded integrate-and-hold circuit, and the first pair of nodes begin to discharge, as shown between 0 and 90 degrees for waveform Va in FIG. 16. The node connected to the transistor of the differential pair that has a higher input voltage from Vin will discharge faster, forming a time-varying voltage differential Va representing an integration of the input differential voltage. As shown in FIG. 16, the time-varying voltage differential corresponds to the lines having different slopes, forming a larger voltage differential voltage as time passes. The middle stage may similarly begin integrating Va by discharging as soon as CK goes high, however as the inputs Va fall below the operating threshold voltage of the transistors of the middle stage, the output nodes of the middle stage stop discharging, and a differential voltage is held for the duration of the sampling interval. In some embodiments, the middle stage may initiate in response to a delayed sampling clock to prevent discharging immediately as the sampling clock initiates the sampling interval. As shown in FIG. 16, the differential voltage on Vb is held for the remaining duration of the cycle, until sampling clock CK (or the delayed sampling clock) goes low again at 180 degrees, initiating recharging of the second pair of nodes prior to the subsequent sampling interval. The voltage Vb may be held for use in pre-cursor compensation, as discussed below with respect to FIG. 17. As illustrated by FIG. 16, the nodes of Vb being held above the threshold voltage of the FETs allows the third pair of nodes of the third stage having voltage Vc to integrate the differential voltage on Vb until the nodes fully discharge. As shown in FIG. 16, the cascaded integrate-and-hold circuit results in two amplification stages, illustrated by 1610, 1620, and 1630. In some embodiments, a latch may be connected to the differential output voltage Vc, and whichever node discharges faster will force the output of the latch to a latched decision. An SR latch may be used in such a configuration, or alternatively other known types of latches.

Figure 15B:
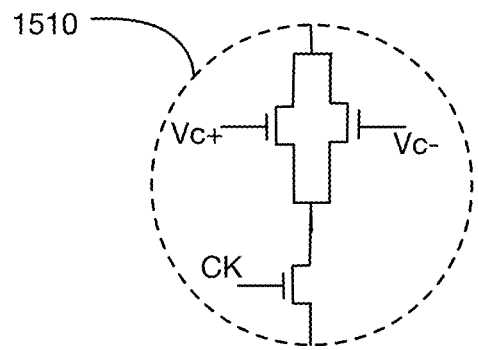
FIGS. 15B and 15C illustrate two configurations of termination pairs of transistors, in accordance with some embodiments.
Figure 15C:
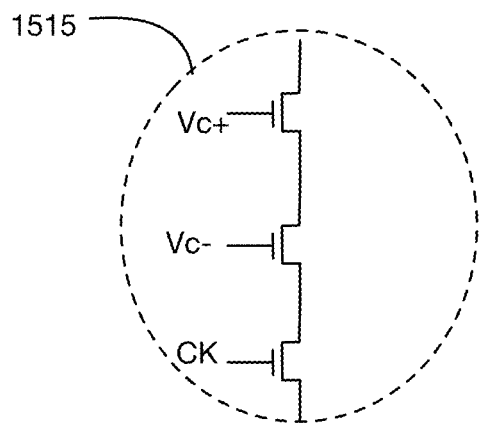

In some embodiments, the first and third differential pairs of transistors may be configured to terminate discharging of the first and third pairs of output nodes, respectively. Such termination may be performed using termination pairs of transistors, for example inserted at 1505. FIGS. 15B and 15C illustrate two possible configurations 1510 and 1515 of termination pairs of transistors, respectively. As shown, 1510 includes parallel-connected termination pairs of transistors configured to terminate discharge of the third pair of nodes in response to both Vc+ and Vc− falling below the threshold voltage of the transistors (e.g., a logic AND gate). 1515 illustrates a series-connected termination pair of transistors configured to terminate discharging of the third pair of nodes in response to only one of Vc+ and Vc− falling below the termination voltage of the transistor (e.g., a logic OR gate).

In some embodiments, each stage may be clocked with the same clock signal as illustrated in FIG. 15A, however alternative embodiments may utilize slightly delayed sampling clocks for each subsequent stage, such as clocks having relationships illustrated in FIGS. 13A and 13B. By introducing delays into the sampling clock to generate first and second delayed sampling clocks, the discharging of each subsequent stage may be delayed, as illustrated by the waveforms of FIG. 16. Alternatively, the nodes Vb and Vc may begin discharging immediately when CK goes high, and integration begins as the differential voltage inputs from the previous stages Va and Vb separate, respectively.

Figure 18:
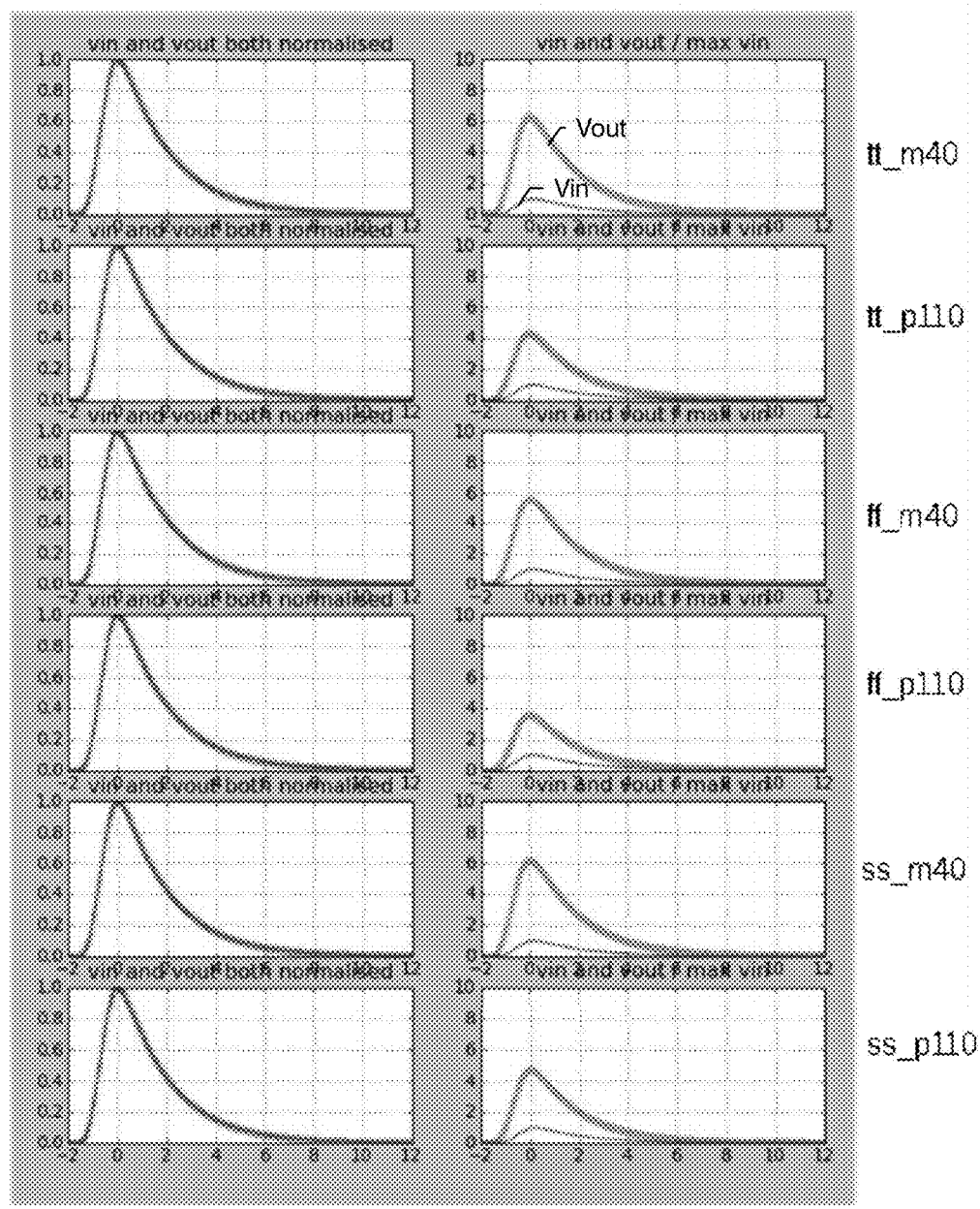
FIG. 18 illustrates gain simulations of a cascaded integrate-and-hold circuit for typical-typical (tt) corners, fast-fast (ff) corners, and slow-slow (ss) corners, in accordance with some embodiments.

FIG. 18 illustrates various gain measurements of a multi-stage sampler in accordance with some embodiments. The graphs in the right-hand column illustrate that a linear gain is achieved for Vin for various simulation parameters. Specifically, from top to bottom, gains of approximately 6V/V, 4V/V, 6V/V, 4V/V, 6V/V, and 5V/V are achieved. the graphs in the left-hand column illustrate the waveforms of Vin and Vout after being normalized. In the left-hand column, the input Vin is scaled by a linear gain value and the waveforms are lined up on top of each other, indicating a linear gain across the frequency band. In FIG. 18, simulations are performed for typical-typical (tt), fast-fast (ff) and slow-slow (ss) corners, as known to those of skill in the art. Further, two simulations were performed using different process variation for each corner.

Figure 19:
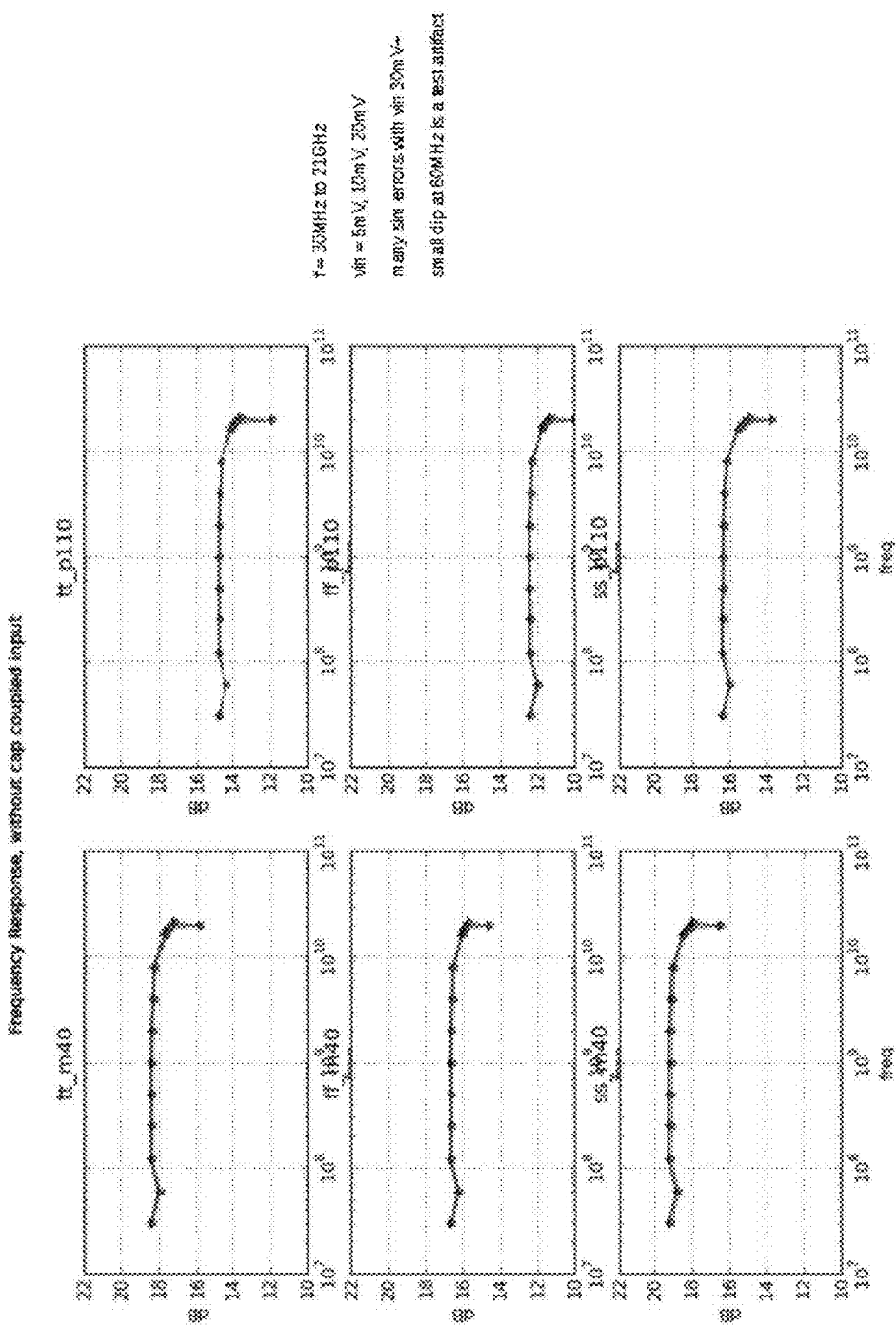
FIG. 19 illustrates frequency response spectrums for the simulations of FIG. 18, in accordance with some embodiments.
Figure 20:
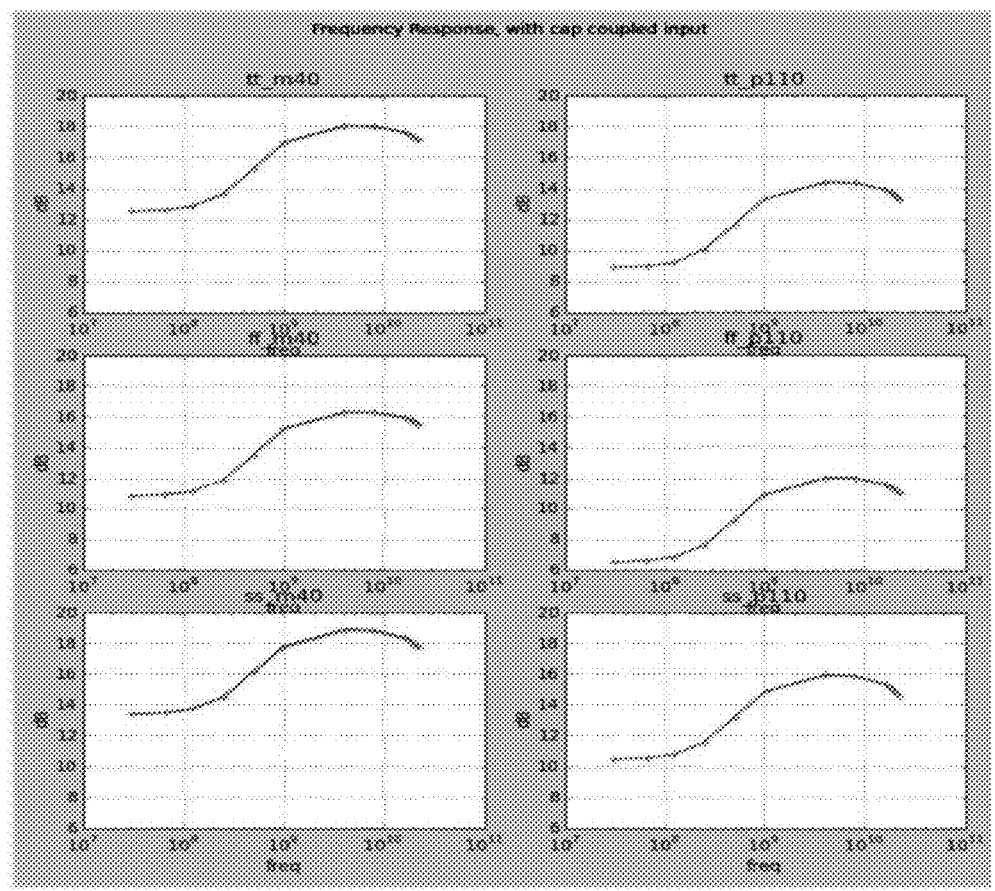
FIG. 20 illustrates frequency response spectrums of a cascaded integrate-and-hold circuit having a capacitor coupled to the input, in accordance with some embodiments.

FIG. 19 illustrates various frequency response spectrums for the above simulations of the cascaded integrate-and-hold circuit over a frequency band of 30 MHz-21 GHz. As shown, the frequency response is very flat across the band. Further, process variation such as temperature variation does not influence the linearity of the frequency response. FIG. 20 illustrates similar diagrams illustrating the linearity of the frequency response among different process variations, however in the systems used to generate the spectrums of FIG. 20 have a capacitor coupled to the input.

Figure 17:
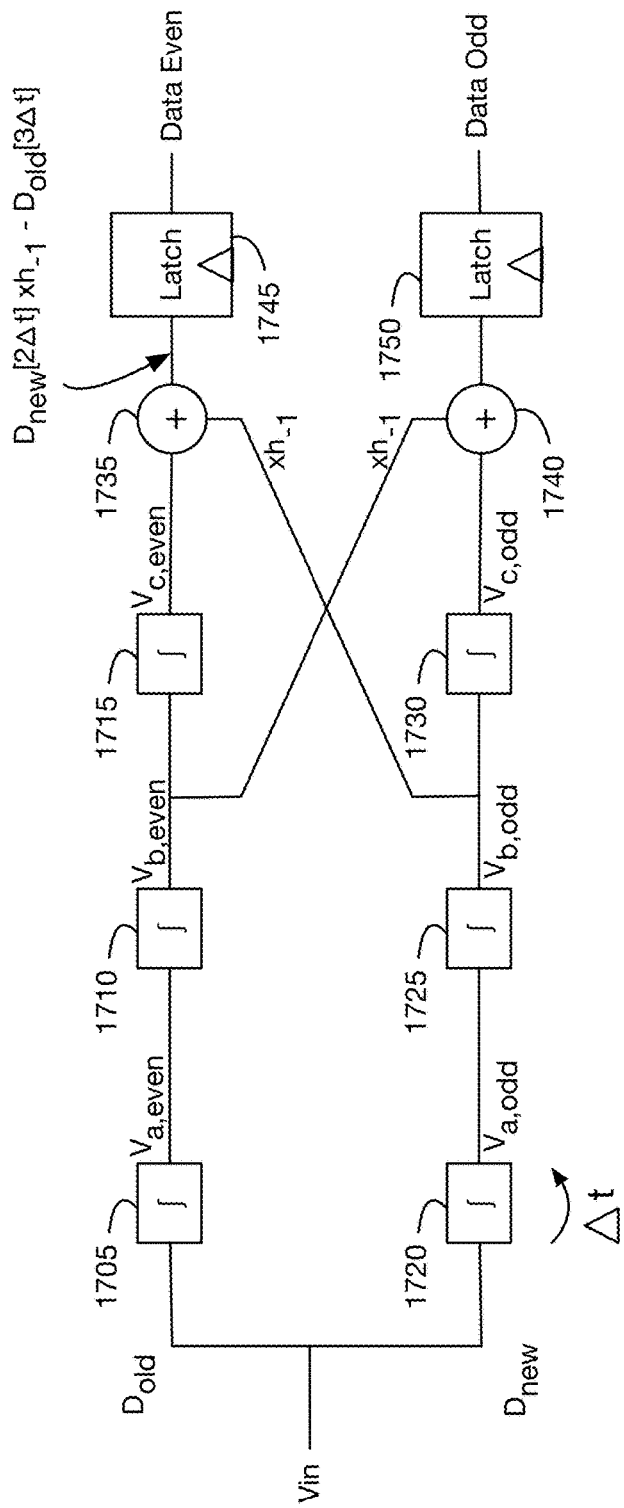
FIG. 17 is a two-phase pre-cursor compensation circuit, in accordance with some embodiments.

FIG. 17 illustrates at least one embodiment utilizing cascaded sample-and-integrate circuits for pre-cursor compensation in a two-phase system. As shown, FIG. 17 includes two phase for alternately processing received information; an odd phase including discrete-time integrator circuits (DTI) 1705, 1710, and 1715, and an even phase including discrete-time integrator circuits 1720, 1725, and 1730. As shown, each DTI may incorporate an associated delay value Δt. Further, each path has a corresponding summation circuit configured to perform the pre-cursor compensation. The "odd" phase includes summation circuit 1735 configured to receive the "odd" data having a delay of 3Δt, and may combine the delayed "odd" data with differential voltage Vb from the even phase, having an associated delay Δ2t illustrated in FIG. 16, which may have an associated DFE correction value $h_{-1}$. The summation is latched 1745, producing the output "Data Even." A similar setup for the odd processing phase is shown in the second path, using summation circuit 1740 and latch 1750 to produce output "Data Odd."

Figure 22:
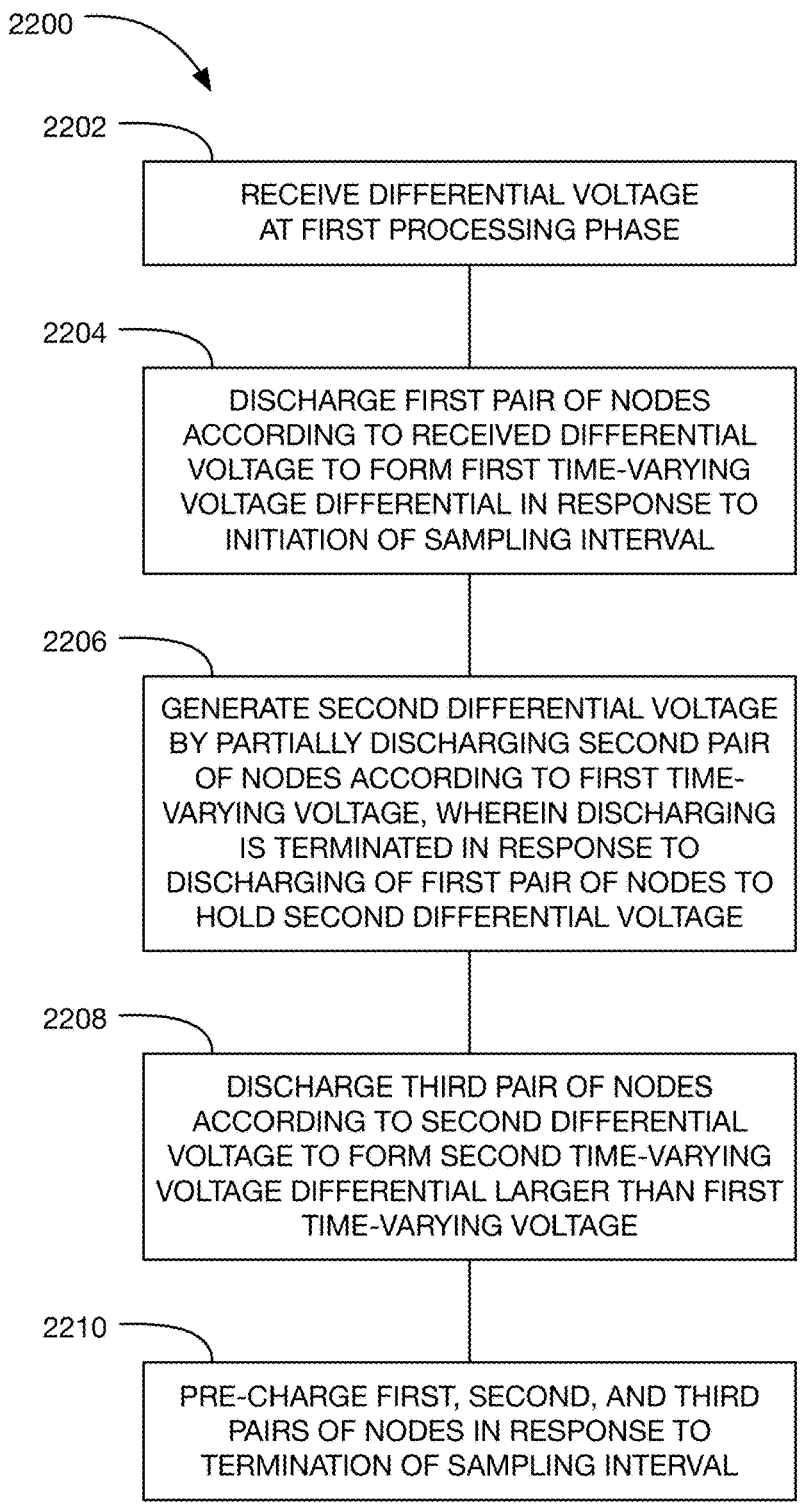
FIG. 22 is a flowchart of a method, in accordance with some embodiments.

FIG. 22 illustrates a flowchart of a method 2200, in accordance with some embodiments. As shown, method 2200 includes receiving 2202 a differential voltage at a first processing phase. In response to an initiation of a sampling interval, a first pair of nodes are discharged 2204 according to the received differential voltage to form a first time-varying voltage differential representing an integration of the differential voltage. The waveform for Va in FIG. 16 illustrates such a time-varying voltage differential in that the voltages on the pair of nodes continues to separate. A second differential voltage is generated 2206 by partially discharging a second pair of nodes. As shown in FIG. 16, the second differential voltage Vb is generated according to the first time-varying voltage differential Va, and the discharging of the second pair of nodes is terminated in response to the discharging of the first pair of nodes. The second differential voltage Vb may then be held for a duration of the sampling interval. A third pair of nodes are discharged 2208 according to the second differential voltage to form a second time-varying voltage differential, shown in FIG. 16 as time-varying voltage differential Vc, the second time-varying voltage differential Vc representing an integration of the second differential voltage Vb similar to how time-varying voltage differential Va represented an integration of the received differential voltage. As shown in FIG. 16, second time-varying voltage differential 1630 of Vc is larger than the first time-varying voltage differential 1610 of Va, corresponding to an amplification. Finally, the first, second, and third pairs of nodes are pre-charged 2210 in response to a termination of the sampling interval, as indicated by the falling edge of the clock signal CK.

In some embodiments, the sampling interval is initiated and terminated according to complementary edges of a sampling clock CK. In some embodiments, as described above, the discharging and pre-charging of the second and third pairs of nodes is initiated according first and second delayed sampling clocks, respectively, the first delayed sampling clock delayed with respect to the sampling clock and the second delayed sampling clock delayed with respect to the first delayed sampling clock. An example of delayed sampling clocks is shown in FIGS. 13A and 13B where sampling clock CK2 has a delay with respect to sampling clock CK1.

In some embodiments, the discharging of the second pair of nodes is terminated in response to a full discharging of the first pair of nodes. In some embodiments, the discharging of the second pair of nodes is terminated in response to the first pair of nodes falling below a threshold voltage. In some embodiments, the threshold voltage corresponds to an operating voltage of a transistor.

In some embodiments, the method further includes providing the second differential voltage to a second processing phase. In such embodiments, the method may further include applying a differential feedback equalization (DFE) factor to the second differential voltage. In some embodiments, the method includes receiving a differential voltage from a second processing phase and adding the received differential voltage from the second processing phase to the second time-varying voltage differential. A dual processing structure associated with such embodiments is shown in FIG. 17.

For descriptive purposes the examples herein show the use of three cascaded processing stages with no limitation implied. Additional stages may be added, as examples to provide additional gain and/or provide additional corrective DC voltage magnitude inputs such as to support deeper DFE correction history, and fewer stages may be used, as examples if lower gain and/or fewer corrective DC voltage magnitude inputs suffice. Similarly, the various apparatus and methods disclosed herein may be combined with each other and with known art to, as one example, provide offset voltage adjustment and introduce a separate DFE correction voltage within a single stage, which may be an element of a multistage system.

For descriptive purposes, the examples herein describe cascaded stages of sampling elements being triggered by a single clock, introducing one clock cycle delay per stage. No limitation is implied, as triggering of individual stages may be initiated using multiple clock phases having any desired timing relationship, as long as the implementation-dependent setup and hold times for the particular embodiment are satisfied. Thus, given appropriately configured triggering clock phases, the overall delay through such a cascade may be a fraction of a clock cycle, or many clock cycles.

Figure 11B:
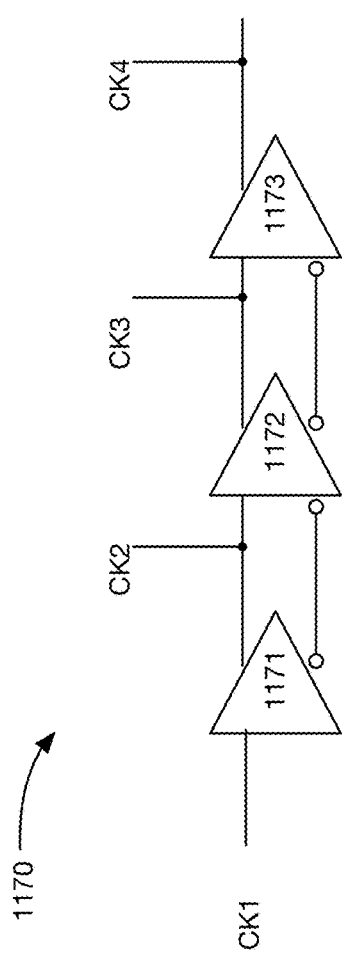
FIG. 11B is a block diagram of a clock delay circuit, in accordance with some embodiments.
Figure 11C:
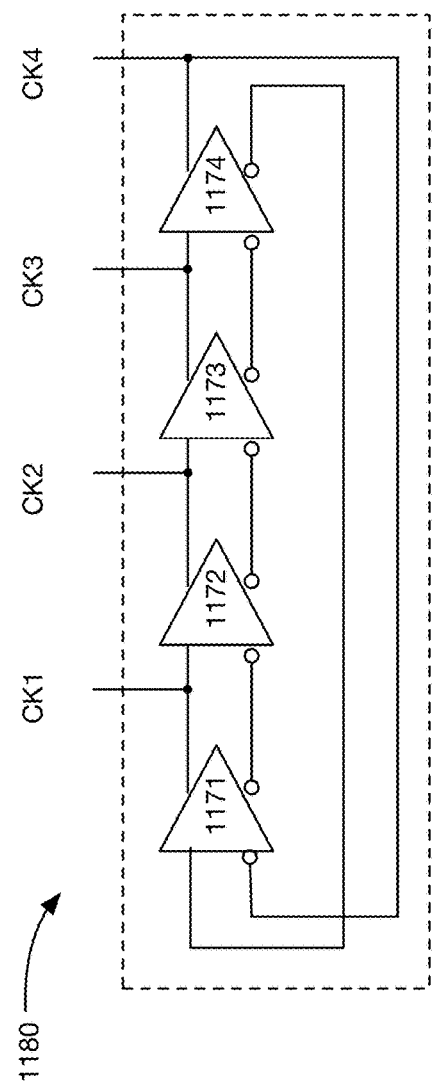
FIG. 11C is a block diagram of a local oscillator generating various phases of a clock circuit, in accordance with some embodiments.

In some embodiments, there may be a group delay $t_1$ from when outputs Va change according to input Vin, in the case of the first stage 1110. In such embodiments, CK2 may be delayed by an amount of at least $t_1$ in order to hold a charge of VDD at the output nodes of 1120 long enough for the inputs Va to stage 1120 to settle. In some embodiments, CK1 may be put through a delay element (not shown) in order to generate clocks CK2, CK3, and CK4, the delay element introducing a delay of at least $t_n$ to each clock, where $t_n$ is the group delay associated with a given stage. In some embodiments, this group delay value may be associated with capacitances in the transistors of each stage, as well as various other factors that are known to cause group delay. In most practical embodiments, $t_n$ will be approximately the same. In some embodiments, $t_n$ is approximately 5-15 psec, however this should not be considered limiting. FIG. 11B illustrates a delay buffer for generating the clock signals CK2-CK4 based on CK1. As shown, a plurality of series-connected gates 1171-1173 are configured to provide clock signals CK2-CK4, respectively based on CK1. Each gate will introduce a delay corresponding to the group delay value $t_n$ described above. FIG. 13A illustrates an exemplary relationship between clocks CK1 and CK2, in accordance with some embodiments. Alternatively, clocks CK1-CK4 may be various phases of a local oscillator clock, generated using, as a non-limiting example, a PLL. FIG. 11C illustrates such an embodiment in which a local oscillator 1180 provides the four phases of the clock signals CK1-CK4. In some embodiments, each adjacent clock signal may have a relative phase relationship of 45 degrees, such as in the example shown in FIG. 11C. In alternative embodiments, each adjacent clock signal may have a relative phase relationship of 90 degrees (not shown). Such embodiments may be used as long as the analog-sampled voltages at the output nodes of a given stage do not begin to decay to VSS before the rising edge clock CK of the subsequent stage. FIG. 13B illustrates an example of clocks CK1 and CK2 having a phase offset of 45 degrees, however it should be noted that any phase offset relationship may be used as long as the phase offset relationship satisfies the above criteria.

Figure 12:
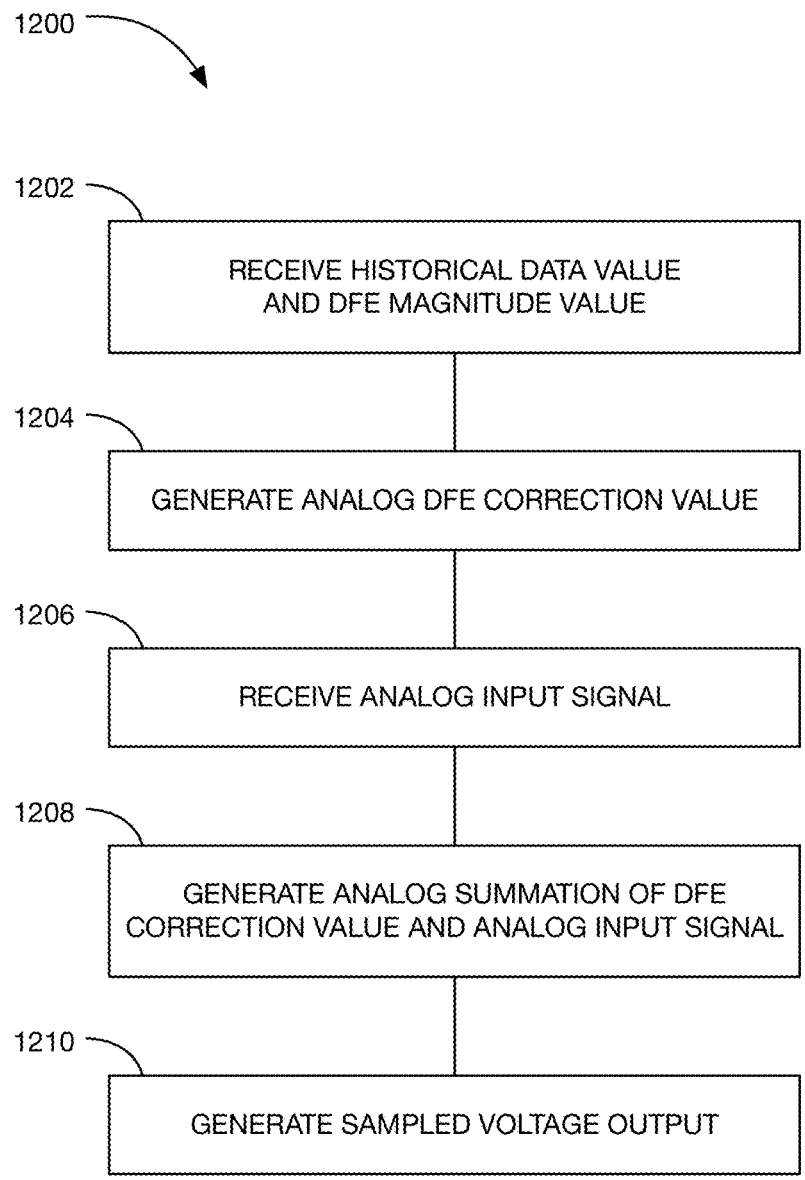
FIG. 12 is a flowchart of a method, in accordance with some embodiments.

FIG. 12 is a flowchart of a method 1200, in accordance with some embodiments. As shown, method 1200 includes receiving, at step 1202, a historical data value from a memory device storing one or more historical data values and a DFE magnitude value from a Decision-Feedback Equalization (DFE) computation circuit. At step 1204, an analog DFE correction value is generated using a decision-feedback offset generator, the analog DFE correction value having a voltage magnitude equal to the DFE magnitude value and a polarity determined by the historical data value received from the memory device. At step 1206, an analog input signal is received and responsively an analog summation of the analog DFE correction value and the received analog input signal is generated at step 1208. At step 1210, a sampler generates a sampled voltage output by sampling the analog summation according to a sampling clock.

In some embodiments, the analog input signal is a sampled voltage output received from a cascaded analog sampler. In alternative embodiments, the analog input signal corresponds to an analog output of a multi-input comparator.

In some embodiments, generating the DFE correction value includes receiving, at a pair of decision feedback branches, the DFE magnitude value in respective inverse-polarity configurations, and selecting, using a selection circuit receiving the historical data value, one of the pair of decision feedback branches to determine the polarity of the DFE correction value.

In some embodiments, the DFE magnitude value includes a high-frequency injection of the analog input signal. In some embodiments, the high-frequency injection of the analog input signal is received via a resistor-capacitor high-pass filter. In some embodiments, the DFE magnitude value comprises a voltage offset signal.

In some embodiments, the sampled voltage output has a propagation delay less than one unit-interval with respect to the received analog input signal. In alternative embodiments, the sampled voltage output has a propagation delay greater than one unit-interval with respect to the received analog input signal. In some embodiments, the memory device comprises a shift register.

Figure 14:
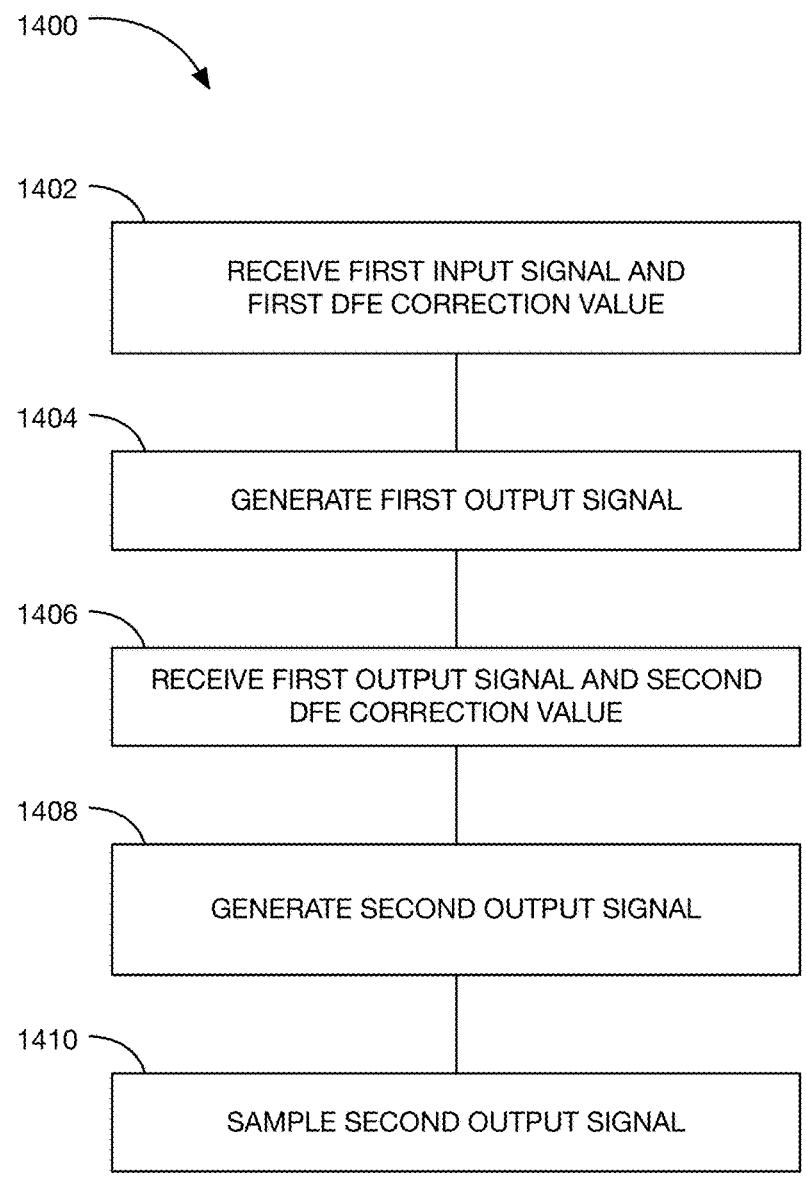
FIG. 14 illustrates a flowchart of a method, in accordance with some embodiments.

FIG. 14 is a flowchart of a method 1400, in accordance with some embodiments. As shown, a first amplifier stage receives, at step 1402, a first analog input signal and a first decision-feedback equalization (DFE) correction value, and responsively generates, at step 1404, a first analog output voltage responsive to a rising edge of a first sampling clock, the first output voltage having an associated group delay value with respect to the first input signal. At step 1406, a second amplifier stage receives the first analog output voltage and a second DFE correction value, and responsively generates, at step 1408, a second analog output voltage responsive to a rising edge of a second sampling clock, the rising edge of the second sampling clock having a delay with respect to the rising edge of the first sampling clock by an amount greater than the associated group delay value. At step 1410, a latch configured generates a sampled output data bit by sampling the second analog output voltage according to a rising edge of a third clock signal having a delay with respect to the rising edge of the second clock signal.

In some embodiments, the method includes generating the second and third clock signals using a delay element receiving the first clock signal as an input. In such embodiments, the respective delay values may be arbitrarily tuned by adjusting parameters (capacitive, etc.) of the delay element In some embodiments, the first, second, and third clock signals have respective fixed phase-offsets. In such embodiments, a phase-locked loop (PLL) generates the clock signals having fixed phase offsets.

In some embodiment, each DFE correction value has (i) a magnitude associated with a calculated DFE magnitude value and (ii) a sign determined by a historical data bit.

In some embodiments, the first received analog input signal is an analog voltage output received from a third amplifier stage.

Background Calibration

Figure 23:
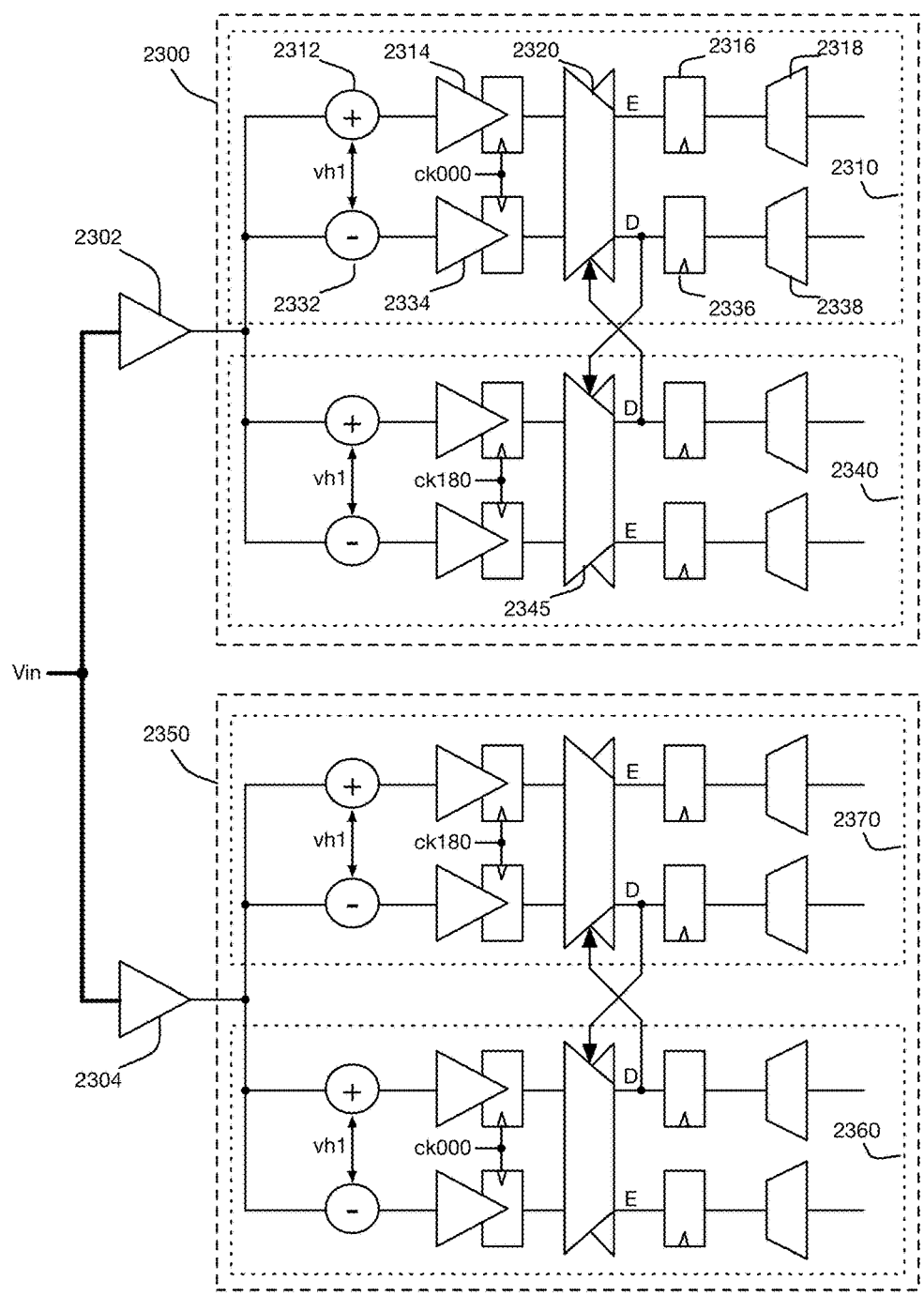
FIG. 23 is a block diagram of a receiver incorporating redundant processing phases allowing background calibration.

FIG. 23 illustrates an embodiment of a receiver allowing background calibration during normal receive operation, in accordance with some embodiments. Vin may be buffered by an integration stage, shown in FIG. 23 as comprising identical stages 2302 and 2304. In a receiver for Orthogonal Differential Vector Signaling (ODVS) code, inputs Vin correspond to multiple wire signals received in a signaling interval communicating symbols of the received code word, and 2302/2304 may thus include multi-input comparators (MICs) or mixers outputting a detected sub-channel of the ODVS code corresponding to an analog linear combination of the received signals. In some embodiments, 2302 and 2304 further include Continuous Time Linear Equalization (CTLE) or other filtering or amplification capability. In some embodiments, 2302 and 2304 incorporate a series of one or more cascaded integration circuits as described above with respect to FIGS. 7, 8, and 15, and may be clocked by a sampling clock (not shown). In such embodiments, the integration circuits 2302 and 2304 may obtain an input Vin corresponding to a MIC output having been processed by a MIC forming the linear combination of signal values on the wires of the multi-wire bus. In some embodiments, the MIC output may be amplified using variable gain amplifier (VGA) elements.

As shown, FIG. 23 further includes two multi-phase receivers 2300 and 2350, where a first multi-phase receiver includes processing slices 2310/2340 and a second multi-phase receiver includes processing slices 2360 and 2370. As shown in FIG. 23, the two identically configured multi-phase receivers are illustrated to minimize the impact of kickback from the samplers of one of the multi-phase receivers (e.g. 2300) upon the other multi-phase receiver (e.g. 2350). In other embodiments, an integration stage comprising a single integration circuit driving both 2300 and 2350 may suffice (not shown).

Multi-phase receiver 2300 illustrates functionality for processing one subchannel of received data using two half-rate processing phases and one level of unrolled or speculative Decision Feedback Equalization (DFE). Multi-phase receiver 2300 is divided into two processing slices being phase-interdependent in that the processing slices alternately process signals received in successive unit intervals to generate output data decisions and phase-error information, and to responsively provide output data decisions to each other for speculative DFE selection. As shown in FIG. 23, processing slice 2310 operates on a first sampling clock phase ck000, and processing slice 2340 operates on a second sampling clock phase ck230. Each processing slice may be composed of a symmetrical layout including two chains of the same elements, e.g. dynamic integrate-and-hold 2312, sampler 2314, data latch 2316, and data buffer 2318 in the first chain, and corresponding circuit elements 2332, 2334, 2336, 2338 in the second chain. Element 2320 may be a dual multiplexer or bus exchanger, configured to either pass the upper input to the upper output and lower input to lower output, or to pass upper input to lower output and lower input to upper output. The selection of the correct output of 2320 may be done based on the received output data decision from the at least one other parallel receiver 2340.

Speculative DFE compensation factor vh1 is applied to both chains; as a positive (e.g. associated with a preceding data "1") factor at 2312, and as a negative (associated with a preceding data "0") factor at 2332. Thus, samplers 2314 and 2334 will simultaneously sample the same input signal at two different offset values (+vh1 and −vh1) as controlled by ck000. Which sample corresponds to data, and which corresponds to a baud-rate CDR edge is determined by the previously-received output data decision D from the second processing slice 2340 which completed detection operation during the previous clock phase ck180, with 2320 directing the appropriate sampler output to data latch 2336, and the corresponding baud rate edge transition to edge latch 2316.

Similarly, second processing slice 2340 operates during clock phase ck180 to provide an output data decision D and an edge transition E, as determined by the output data decision provided by the first processing slice 2310. It should be noted that some embodiments may extend to more than two phases, and thus more than two processing slices. For example, in an embodiment having four processing phases, which may include ck000, ck090, ck180, and ck270 (not shown), the processing slice operating on phase ck000 may provide an output data decision to the processing slice operating on ck090, and may receive an output data decision from the processing slice operating on ck270. Thus, each processing slice is phase-interdependent with at least one other processing slice of the plurality of processing slices and may receive output data decisions from and provide output data decisions to processing slices receiving respective adjacent phases of the sampling clock.

While multi-phase receiver 2300 is processing active receive data and maintaining clock synchronization, the apparatus may include a second multi-phase receiver 2350 including at least one processing slice that may remain idle or powered down. In one embodiment, multi-phase receiver 2350 is calibrated as a background or non-intrusive operation during normal data reception. It is well known that both due to process variations and temperature gradients, the analog characteristics of integrated circuit transistors vary, and will further vary over time. Thus, on a periodic schedule each element of the multi-phase receiver 2350 may be calibrated, by comparing results obtained in block 2350 with corresponding values obtained in active processing chain 2300. In some embodiments, the receiver may include a control circuit (not shown) configured to initiate a calibration sequence for the current offline (e.g., non-data processing path) multi-phase receiver. In some embodiments, the control circuit may be configured to periodically initiate calibration according to a fixed time schedule, each calibration cycle occurring according to a predetermined time interval. Alternatively, the control circuit may include monitoring circuits to monitor time-varying characteristics that may impact circuit performance. One particular example could be a temperature monitoring circuit configured to monitor on-chip temperatures, and the control circuit could be configured to initiate a calibration cycle in response to various changes in temperature. In at least one embodiment, the detection thresholds for the samplers in 2350 may be calibrated by being adjusted until the detected sequence of "1"s and "0"s is identical to the output data decisions generated by multi-phase receiver 2300, and the resulting threshold values retained for subsequent use. Such a calibration may compare the output data decisions generated by multi-phase receiver 2300 to the outputs of processing slices 2360/2370 using a comparison and analysis circuit (not shown).

In some embodiments, the redundant multi-phase receiver 2350 is utilized as an "eye-scope" sampler to provide useful diagnostic and operational control information, as well as providing a mechanism for efficient calibration. As processing slices 2360 and 2370 in multi-phase receiver 2350 are not processing active data, the detection thresholds for the samplers may be adjusted arbitrarily without risk of losing data. As one example, the thresholds may be incremented over their full range, allowing "bottom of eye" and "top of eye" to be measured. During this adjustment, the DFE correction factor may be set to zero, permitting both sampling chains to obtain identical information. In an alternative embodiment, a DFE correction factor may be used to intentionally offset the samplers in the two processing chains by a known amount, permitting two eye measurements to be obtained simultaneously. At least one alternative embodiment allows the data-driven selection of multiplexer or bus exchanger 2345 to be overridden or set to a fixed value in this mode, so that upper and lower sampler results will consistently appear on the same outputs.

In some embodiments where the redundant multi-phase receiver 2350 is operating as an eye-scope sampler, the inter-phase feedback circuits exchanging output data decisions are not needed, but may be included for circuit symmetry. In such embodiments, the effect of the inter-phase feedback for eye-scope may be controlled via a digital circuit in the receiver. Alternatively, if speed is not a problem, then the inter-phase feedback circuits may be disabled or turned off during eye-scope operation. In a first embodiment, the clocks applied to processing slices 2360 and 2370 for measuring eye-scope are the same clocks that are applied to processing slices 2310 and 2340, respectively. In such embodiments, the voltage offset of eye slicers may be adjusted, and a plot of the vertical eye may be generated. Such an embodiment is non-destructive, and processing slices 2310 and 2340 may continue to produce valid data output decisions. Sweeping the clock in the horizontal domain to plot the complete eye may be done by rotating the phase of the main sampling clocks using e.g., a phase interpolator. Such an action will result in a destructive eye-scope as the clocks are tied to the main clock phases.

In alternative embodiments, a separate clock phase independent from the main clock phase is used to clock processing slices 2360 and 2370. Such clocks may be rotated independently and a vertical eye or a full eye may be constructed in a non-destructive manner. In at least one embodiment, the separate clock may be generated using an independent PI, as illustrated by PI 2430 in FIG. 24.

The range of calibration adjustments may include gain, offset, and frequency compensation for CTLE/MIC linear elements, gain, offset, and frequency compensation for dynamic elements such as integrate-and-hold samplers, bias levels, sampler thresholds, DFE correction factors, and timing chain delays.

As is apparent from their full symmetric redundancy, the operational functions of multi-phase receivers 2300 and 2350 may be exchanged transparently once background calibration is completed, allowing processing blocks 2360 and 2370 in multi-phase receiver 2350 to handle active data and clock recovery, while processing slices 2310 and 2340 in multi-phase receiver 2300 are powered down, put into idle mode, calibrated, or used to make eye-scope measurements. The illustrative use of two processing phases does not imply limitation, the described embodiments being equally applicable to different numbers of processing slices. Further, some embodiments may selectable configure at least one processing slice 2360/2370 to operate in a single operating mode of a plurality of operating modes, the plurality of operating modes including (i) making eye-scope measurements, (ii) operating in the multi-phase processing path for a duration in which at least one of the first plurality of processing slices 2310/2340 are calibrated, or (iii) shutting off after being calibrated.

It should be noted that in some embodiments, multi-phase receiver 2350 may not be an exact copy of multi-phase receiver 2300. In some such embodiments, multi-phase receiver may be composed of processing slice 2370, which may selectively interconnected to e.g. processing slice 2310 of multi-phase receiver 2300. In such an embodiment, processing slice 2370 may be connected to ph180 of the sampling clock, and processing slice 2340 may be calibrated and/or used to make eye-scope measurements.

Figure 24:
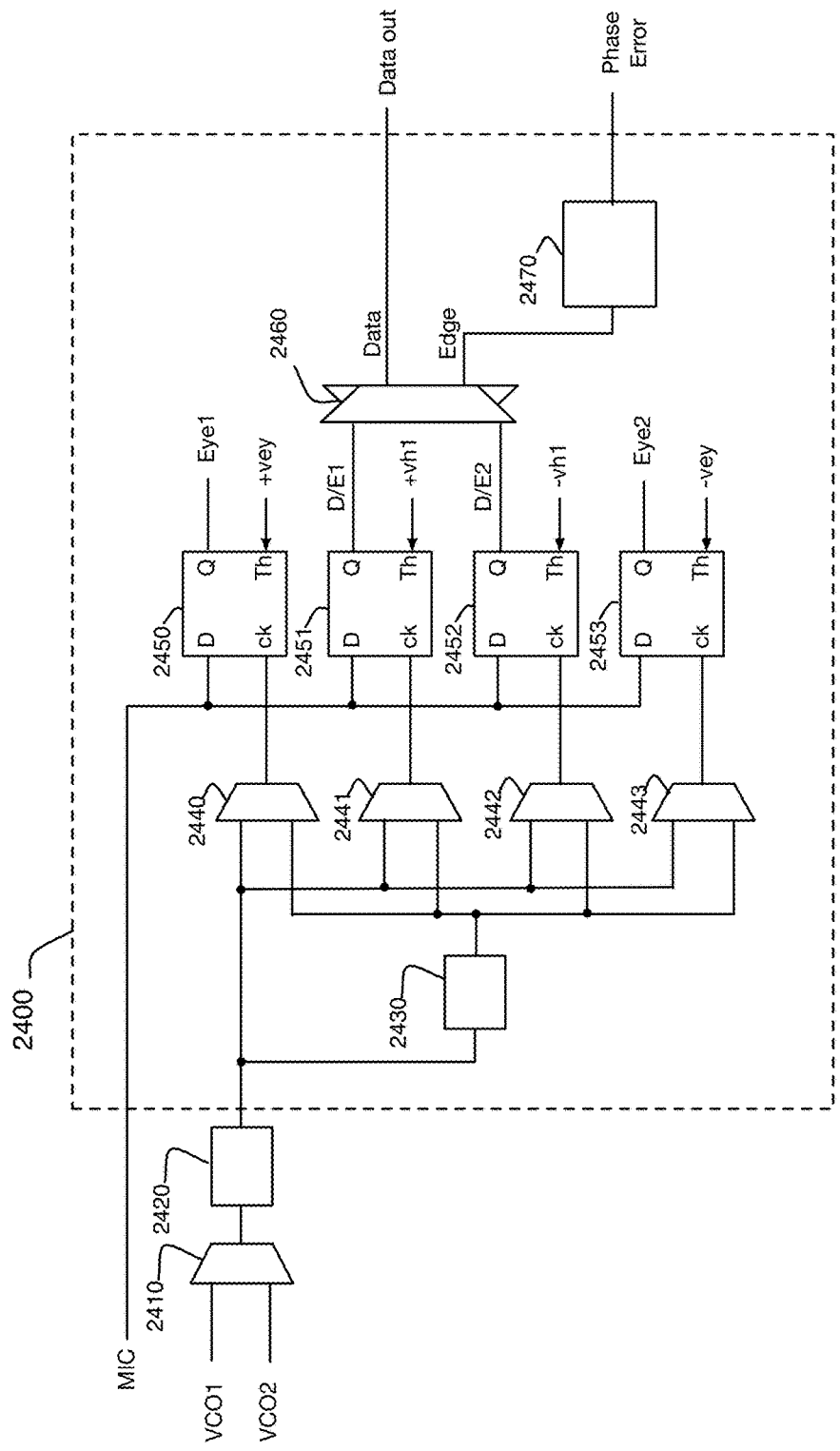
FIG. 24 is a block diagram of a receiver embodiment incorporating data, edge, and eye sampling.

FIG. 24 illustrates another embodiment of a receive chain 2400, in which multiple samplers are provided, allowing simultaneous sampling of data, baud-rate CDR edges, and eye statistics. Four samplers 2450, 2451, 2452, 2453 are used, with samplers 2451/2452 detecting data and baud-rate CDR edges at sampling thresholds +vh1 and −vh1 as previously described, while samplers 2450/2453 measure eye statistics at independently adjustable thresholds +vey and −vey. Multiplexer or bus exchanger 2460 directs received data to Data Out, and detected baud rate edges to charge pump 2470, providing a phase error result that may be used to update the PLL VCO phase.

The illustrated embodiment allows great flexibility in configuring sampling clocks. Either VCO1 or VCO2 may be selected by multiplexer 2410 as the sampling clock source. A variable delay buffer (or, as an alternative embodiment, a phase interpolator) 2420 may optionally provide an incremental phase adjustment or offset. A second variable delay buffer or phase interpolator 2430 allows further phase adjustment, with multiplexers 2440, 2441, 2442, 2443 allowing either direct sampling clock or delayed sampling clock to be used by each of samplers 2450, 2451, 2452, 2453.

Thus, as one example offered without limitation, 2420 may be adjusted to provide an optimized data sample timing for this particular sub-channel, with samplers 2451/2452 controlled by the direct sampling clock. Simultaneously, samplers 2450/2453 may be controlled by the delayed sampling clock allowing eye statistics to be gathered with a time-offset controlled by 2430. Independent adjustment of vertical sampling offset vey and horizontal timing offset 2430 permits the gathering of statistical data for a full two-dimensional eye diagram.

As will be readily apparent, the flexible sampling clock capability of FIG. 24 may be combined with the redundant multi-phase receivers of FIG. 23, allowing eye statistics to be gathered by a processing block with controllable time-offsets, while another processing block detects data with normal sampling clock timing.

In at least one embodiment, data is passed through processing chains as differential analog signals. In some embodiments, exemplary buffering elements 2318, 2338 etc. of FIG. 23 may include data multiplexing and/or storage, and clock recovery functions including PLL charge pumps.

Figure 25:
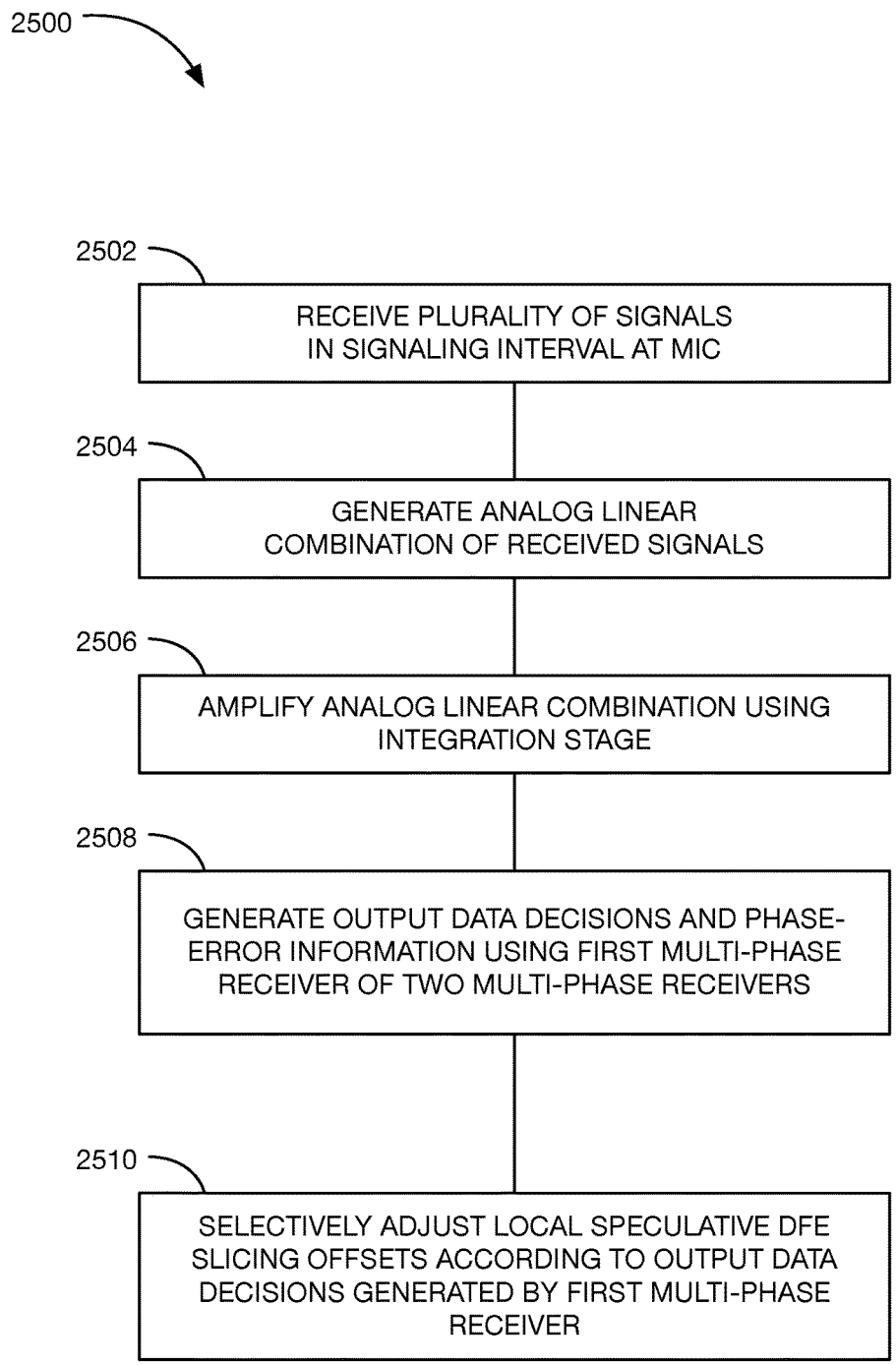
FIG. 25 is a flowchart of a method, in accordance with some embodiments.

FIG. 25 illustrates a flowchart of a method 2500, in accordance with some embodiments. As shown, method 2500 includes receiving 2502 a plurality of signals in a signaling interval at a multi-input comparator (MIC), and responsively generating 2504 an analog linear combination Vin of the received signals. The analog linear combination of the received signals is amplified 2506 using an integration stage e.g., 2302/2304, and the amplified differential voltage is received by two multi-phase receivers 2300 and 2350, each multi-phase receiver comprising one or more processing slices 2310/2340/2360/2370, each multi-phase receiver operating in a multi-phase processing path for processing the amplified differential voltage. Output data decisions and phase-error information are generated 2508 using a first multi-phase receiver 2300 of the two multi-phase receivers, and local speculative DFE slicing offsets +/−vh1 are selectively adjusted 2510 in a second multi-phase receiver 2350 of the two multi-phase receivers according to the output data decisions generated by the first multi-phase receiver 2300.

In some embodiments, as shown in FIG. 23, the two multi-phase receivers 2300 and 2350 have a symmetrical circuit layout.

In some embodiments, the method includes performing pre-cursor compensation on the received analog linear combination to generate the amplified differential voltage by applying a DFE correction value to the received analog linear combination via the integration stage.

In some embodiments, each processing slice of the plurality of processing slices 2310/2340 of the first multi-phase receiver 2300 processes the amplified differential voltage by sampling the amplified differential voltage according to a respective phase of a plurality of phases of a sampling clock. In some such embodiments, each processing slice (i) receives an output data decision from and (ii) provides an output data decision to respective processing slices receiving adjacent respective phases of the plurality of phases of the sampling clock. In some embodiments, the method further includes providing at least one of the phases of the plurality of phases of the sampling clock to at least one processing slice 2360/2370 of the plurality of processing slices of the second multi-phase receiver 2350.

In some embodiments, the method further includes selectively configuring the second multi-phase receiver to utilize at least one processing slice of the plurality of processing slices to make eye-scope measurements. In some such embodiments, an eye scope clock signal is provided to the at least one processing slice of the second multi-phase receiver, the eye scope clock signal generated by a phase interpolator operating on at least two phases of a plurality of phases of a sampling clock. In some embodiments, the phase of the eye scope clock signal is incrementally rotated to make eye-scope measurements corresponding to eye width. In some embodiments, the method further includes adjusting slicer offset values of the at least one processing slice and sampling the amplified differential voltage to make eye-scope measurements corresponding to eye height.

The invention claimed is:

1. An apparatus comprising:
   a multi-input comparator (MIC) configured to receive a plurality of signals in a signaling interval from wires of a multi-wire bus and to responsively generate an analog linear combination of the received signals;
   an integration stage configured to receive the analog linear combination of the received signals and to responsively amplify the received analog linear combination to generate an amplified differential voltage; and
   two multi-phase receivers connected in parallel to the integration stage, each multi-phase receiver comprising one or more processing slices, each multi-phase receiver configured to receive the amplified differential voltage and to operate in a multi-phase processing path for processing the amplified differential voltage, the two multi-phase receivers comprising:
     a first multi-phase receiver of the two multi-phase receivers configured to process the amplified differential voltage to generate output data decisions and phase-error information; and
     a second multi-phase receiver selectively configured to adjust local speculative decision feedback equalization (DFE) slicing offsets according to the output data decisions generated by the first multi-phase receiver.

2. The apparatus of claim 1, wherein the two multi-phase receivers comprise a symmetrical circuit layout.

3. The apparatus of claim 1, wherein the integration stage is configured to perform pre-cursor compensation on the received analog linear combination to generate the amplified differential voltage by applying at least one DFE correction value to the received analog linear combination.

4. The apparatus of claim 1, wherein each processing slice of the one or more processing slices of the first multi-phase receiver is configured to sample the received amplified differential voltage according to a respective phase of a plurality of phases of a sampling clock.

5. The apparatus of claim 4, wherein each processing slice is configured to (i) receive an output data decision from and to (ii) provide an output data decision to respective processing slices receiving adjacent respective phases of the plurality of phases of the sampling clock.

6. The apparatus of claim 4, wherein the at least one processing slice of the second multi-phase receiver is configured to receive at least one of the phases of the plurality of phases of the sampling clock.

7. The apparatus of claim 1, wherein the second multi-phase receiver is selectively configurable to utilize at least one processing slice of the one or more processing slices to make eye-scope measurements.

8. The apparatus of claim 7, wherein the at least one processing slice is configured to receive an eye scope clock signal generated by a phase interpolator operating on at least two phases of a plurality of phases of a sampling clock.

9. The apparatus of claim 8, wherein the phase interpolator is configured to incrementally rotate a phase of the eye scope clock signal to make the eye-scope measurements corresponding to eye width.

10. The apparatus of claim 7, wherein the at least one processing slice is configured to adjust slicer offset values and to sample the amplified differential voltage to make eye-scope measurements corresponding to eye height.

11. The apparatus of claim 10, wherein the eye-scope measurements corresponding to eye height comprise a bottom-of-eye measurement and a top-of-eye measurement.

12. The apparatus of claim 11, wherein the at least one processing slice is configured to set the local speculative DFE slicing offsets to zero, and to adjust the slicer offset value to find the bottom-of-eye measurement and the top-of-eye measurement.

13. The apparatus of claim 11, wherein the at least one processing slice is configured to adjust the local speculative DFE slicing offsets independently to determine the bottom-of-eye measurement and the top-of-eye measurement.

14. The apparatus of claim 1, wherein the local speculative DFE slicing offsets are adjusted until a detected sequence of '1' and '0' decisions in the second multi-phase receiver is identical to the output data decisions generated by the first multi-phase receiver.

15. A method comprising:
   receiving a plurality of signals in a signaling interval at a multi-input comparator (MIC), and responsively generating an analog linear combination of the received signals;
   amplifying the analog linear combination of the received signals using an integration stage;
   receiving the amplified differential voltage at two multi-phase receivers, each multi-phase receiver comprising one or more processing slices, the two multi-phase receivers operating in a multi-phase processing path for processing the amplified differential voltage, wherein processing the amplified differential voltage comprises:

generating output data decisions and phase-error information using a first multi-phase receiver of the two multi-phase receivers; and selectively adjusting local speculative decision feedback equalization (DFE) slicing offsets of a second multi-phase receiver of the two multi-phase receivers according to the output data decisions generated by the first multi-phase receiver.

16. The method of claim 11, wherein the two multi-phase receivers have a symmetrical circuit layout.

17. The method of claim 11, further comprising performing pre-cursor compensation on the received analog linear combination to generate the amplified differential voltage by applying a DFE correction value to the received analog linear combination via the integration stage.

18. The method of claim 11, wherein each processing slice of the one or more processing slices of the first multi-phase receiver processes the amplified differential voltage by sampling the amplified differential voltage according to a respective phase of a plurality of phases of a sampling clock.

19. The method of claim 14, wherein each processing slice (i) receives an output data decision from and (ii) provides an output data decision to respective processing slices receiving adjacent respective phases of the plurality of phases of the sampling clock.

20. The method of claim 14, further comprising providing at least one of the phases of the plurality of phases of the sampling clock to at least one processing slice of the one or more processing slices of the second multi-phase receiver.

21. The method of claim 11, further comprising selectively configuring the second multi-phase receiver to utilize at least one processing slice of the one or more processing slices to make eye-scope measurements.

22. The method of claim 17, further comprising providing an eye scope clock signal to the at least one processing slice, the eye scope clock signal generated by a phase interpolator operating on at least two phases of a plurality of phases of a sampling clock.

23. The method of claim 18, further comprising incrementally rotating a phase of the eye scope clock signal to make eye-scope measurements corresponding to eye width.

24. The method of claim 17, further comprising adjusting slicer offset values of the at least one processing slice and sampling the amplified differential voltage to make eye-scope measurements corresponding to eye height.

25. The method of claim 24, wherein the eye-scope measurements corresponding to eye height comprise a bottom-of-eye measurement and a top-of-eye measurement.

26. The method of claim 25, wherein the local speculative DFE slicing offsets are set to zero and wherein the slicer offset values are adjusted to determine the bottom-of-eye measurement and the top-of-eye measurement.

27. The method of claim 25, further comprising independently adjusting the local speculative DFE slicing offsets in the at least one processing slice to determine the bottom-of-eye measurement and the top-of-eye measurement.

28. The method of claim 15, further comprising adjusting the local speculative DFE slicing offsets until a detected sequence of '1' and '0' decisions in the second multi-phase receiver is identical to the output data decisions generated by the first multi-phase receiver.

* * * * *